United States Patent
Shimizu

(10) Patent No.: US 11,824,083 B2
(45) Date of Patent: Nov. 21, 2023

(54) SEMICONDUCTOR DEVICE, SEMICONDUCTOR DEVICE MANUFACTURING METHOD, INVERTER CIRCUIT, DRIVE DEVICE, VEHICLE, AND ELEVATOR

(71) Applicant: KABUSHIKI KAISHA TOSHIBA, Tokyo (JP)

(72) Inventor: Tatsuo Shimizu, Shinagawa (JP)

(73) Assignee: KABUSHIKI KAISHA TOSHIBA, Tokyo (JP)

( * ) Notice: Subject to any disclaimer, the term of this patent is extended or adjusted under 35 U.S.C. 154(b) by 228 days.

(21) Appl. No.: 17/446,992

(22) Filed: Sep. 7, 2021

(65) Prior Publication Data
US 2022/0302250 A1 Sep. 22, 2022

(30) Foreign Application Priority Data
Mar. 18, 2021 (JP) ................. 2021-045127

(51) Int. Cl.
*H01L 29/04* (2006.01)
*H01L 29/66* (2006.01)
*H01L 29/78* (2006.01)
*B60R 16/023* (2006.01)
*H01L 29/167* (2006.01)
(Continued)

(52) U.S. Cl.
CPC ........ *H01L 29/045* (2013.01); *B60R 16/0231* (2013.01); *H01L 29/167* (2013.01); *H01L 29/66068* (2013.01); *H01L 29/7802* (2013.01); *B60L 53/20* (2019.02); *B61C 3/00* (2013.01); *B66B 11/043* (2013.01); *H01L 21/2253* (2013.01); *H01L 21/266* (2013.01); *H01L 21/26513* (2013.01); *H01L 21/26533* (2013.01);
(Continued)

(58) Field of Classification Search
None
See application file for complete search history.

(56) References Cited

U.S. PATENT DOCUMENTS

2012/0292742 A1* 11/2012 Itoh .............. H01L 29/7395
257/E29.005
2016/0284804 A1* 9/2016 Shimizu .......... H01L 29/1608
(Continued)

FOREIGN PATENT DOCUMENTS

JP 2003-224124 A 8/2003
JP 2018-035051 A 3/2018
(Continued)

*Primary Examiner* — Alexander G Ghyka
(74) *Attorney, Agent, or Firm* — Oblon, McClelland, Maier & Neustadt, L.L.P.

(57) ABSTRACT

A semiconductor device of embodiments includes: a silicon carbide layer having a first face and a second face opposite to the first face, and including a p-type silicon carbide region in contact with the first face, a percentage of a first silicon atom among a plurality of silicon atoms present in a first layer as an uppermost layer being equal to or more than 90% and a site position of the first silicon atom being different from a site position of a silicon atom in a third layer from the first face and the same as a site position of a silicon atom in a fifth layer from the first face; a gate electrode; a silicon oxide layer between the silicon carbide layer and the gate electrode; and a region between the silicon carbide layer and the silicon oxide layer including nitrogen.

10 Claims, 28 Drawing Sheets

(51) Int. Cl.
  *B60L 53/20* (2019.01)
  *H01L 29/16* (2006.01)
  *H01L 21/266* (2006.01)
  *H01L 21/225* (2006.01)
  *H01L 21/265* (2006.01)
  *H02M 7/537* (2006.01)
  *H02P 27/06* (2006.01)
  *B66B 11/04* (2006.01)
  *B61C 3/00* (2006.01)

(52) U.S. Cl.
  CPC ......... *H01L 29/1608* (2013.01); *H02M 7/537* (2013.01); *H02P 27/06* (2013.01)

(56) References Cited

U.S. PATENT DOCUMENTS

| | | | |
|---|---|---|---|
| 2017/0345903 A1* | 11/2017 | Shimizu | B60L 15/007 |
| 2018/0069081 A1 | 3/2018 | Nagasawa et al. | |
| 2020/0035791 A1* | 1/2020 | Oshima | H01L 29/0623 |
| 2021/0043723 A1* | 2/2021 | Kyogoku | H01L 29/7813 |
| 2021/0083062 A1* | 3/2021 | Shimizu | H01L 29/518 |
| 2021/0288175 A1 | 9/2021 | Shimizu et al. | |
| 2022/0005925 A1 | 1/2022 | Shimizu et al. | |
| 2022/0085173 A1* | 3/2022 | Noguchi | H01L 21/26506 |
| 2022/0302261 A1* | 9/2022 | Shimizu | H01L 29/66053 |
| 2023/0082881 A1* | 3/2023 | Shimizu | H01L 21/0262 257/77 |
| 2023/0197790 A1* | 6/2023 | Shimizu | H01L 29/1608 257/77 |

FOREIGN PATENT DOCUMENTS

| | | |
|---|---|---|
| JP | 2020-027894 A | 2/2020 |
| JP | 2021-145113 A | 9/2021 |
| JP | 2022-12282 A | 1/2022 |

* cited by examiner

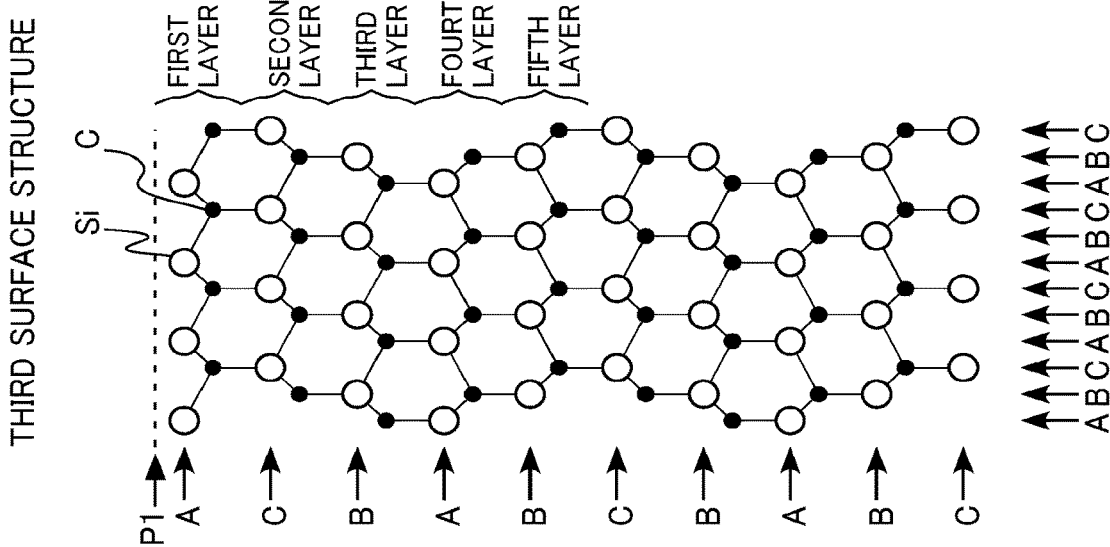
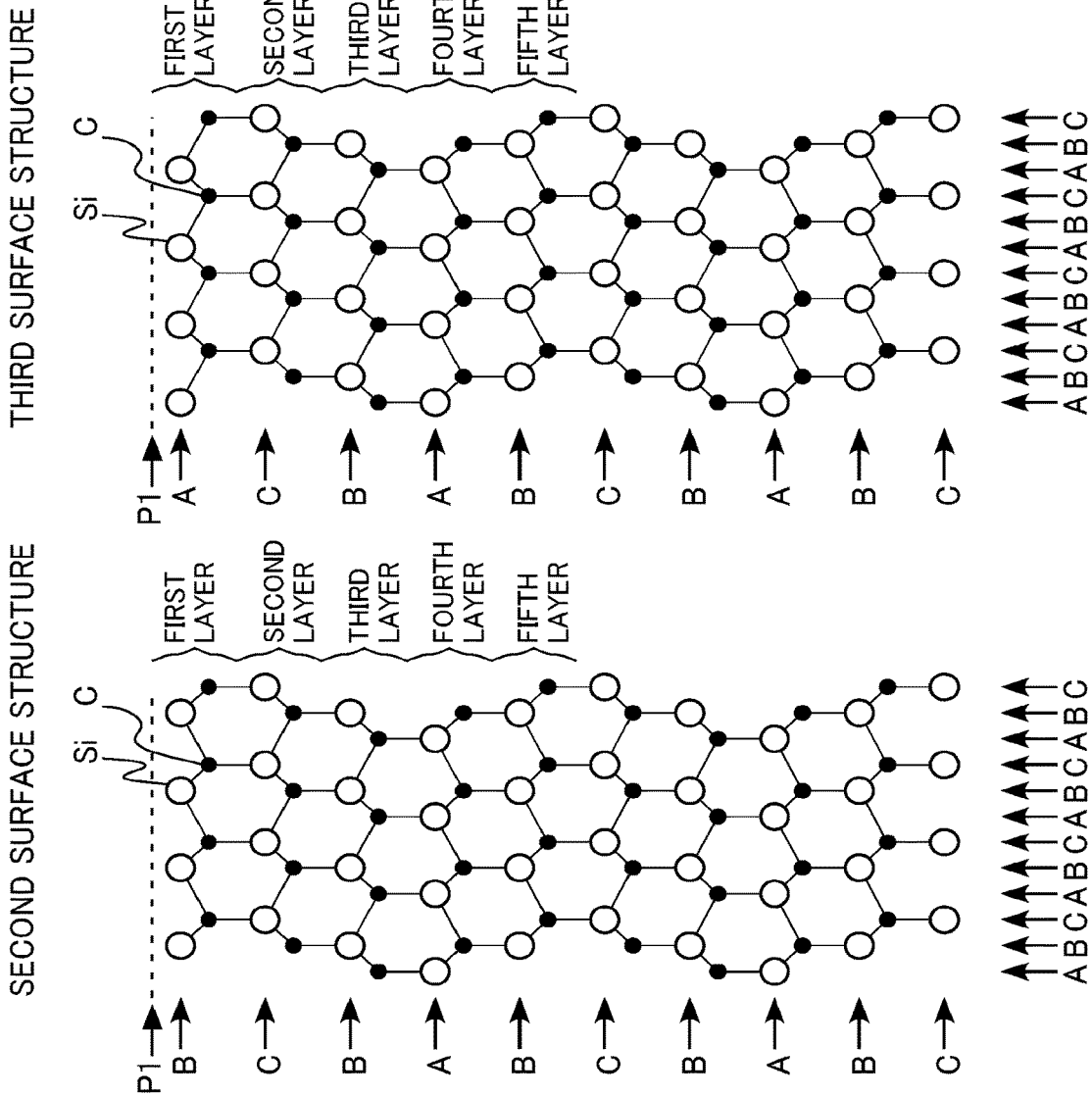
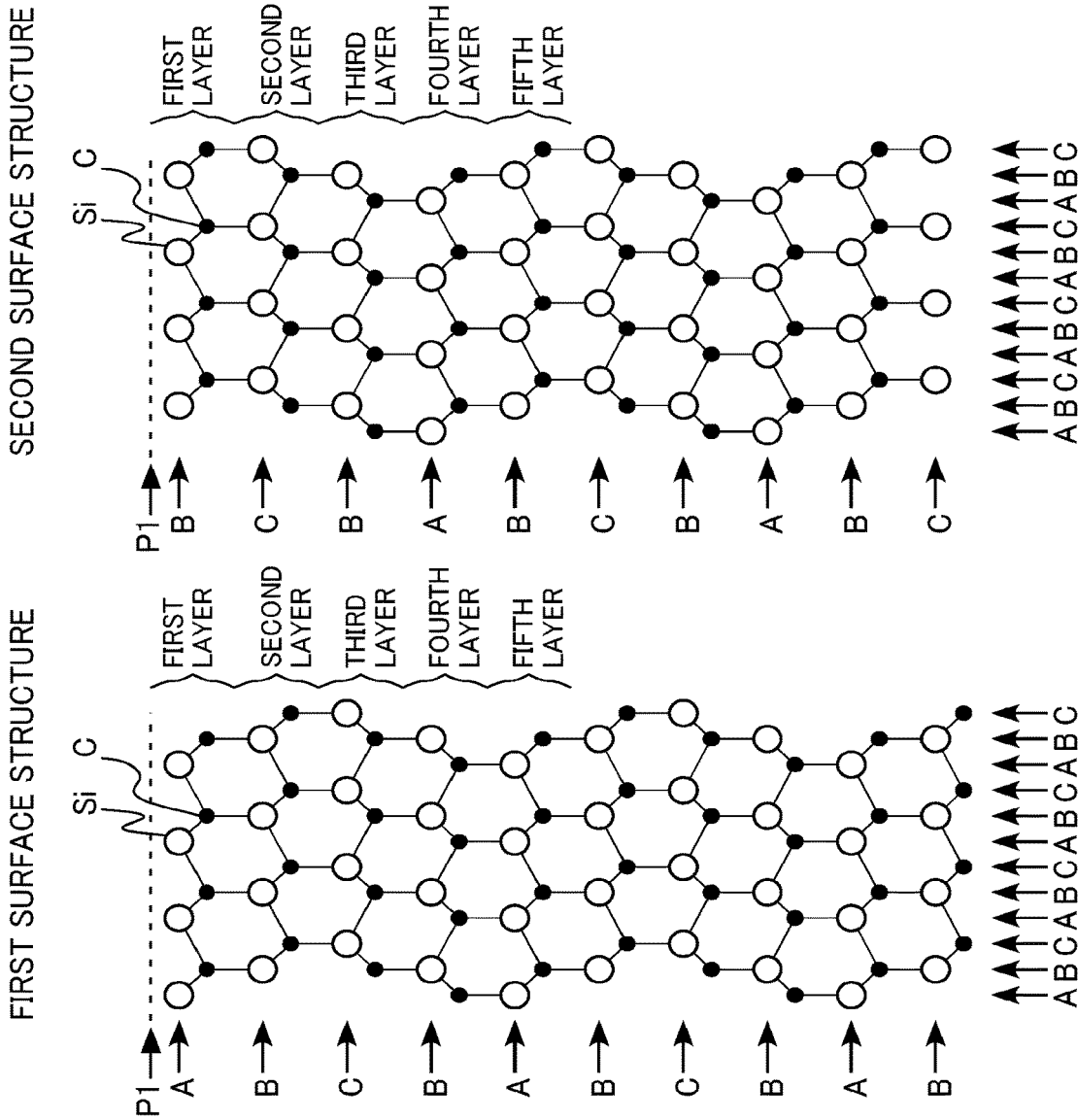

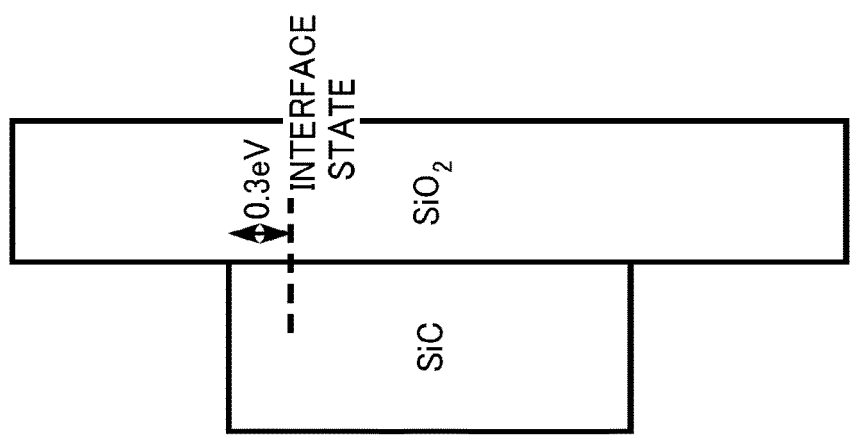
FIG.21C THIRD SURFACE STRUCTURE
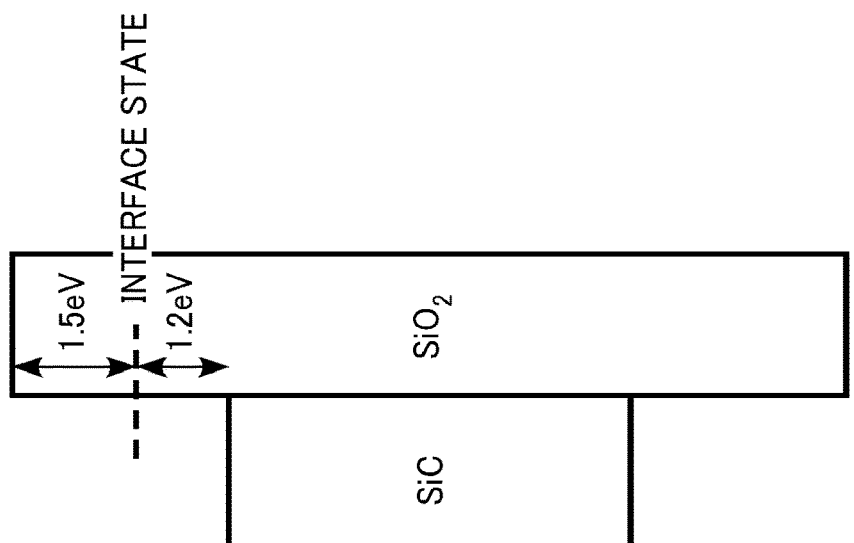
FIG.21B SECOND SURFACE STRUCTURE
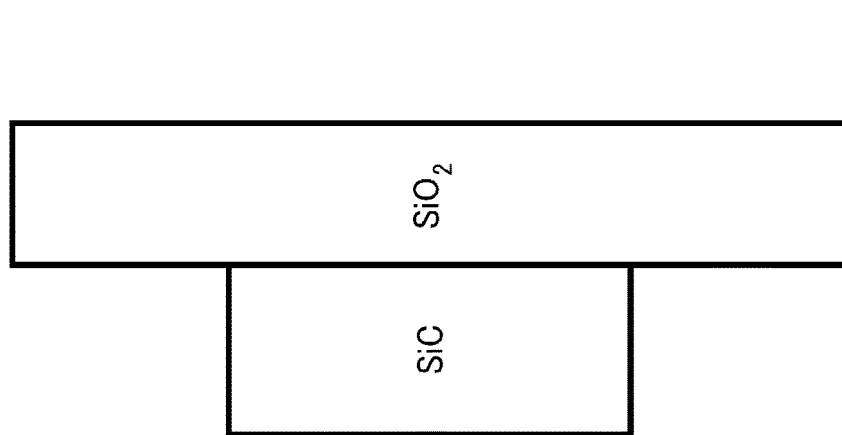
FIG.21A FIRST SURFACE STRUCTURE

SEMICONDUCTOR DEVICE, SEMICONDUCTOR DEVICE MANUFACTURING METHOD, INVERTER CIRCUIT, DRIVE DEVICE, VEHICLE, AND ELEVATOR

CROSS-REFERENCE TO RELATED APPLICATION

This application is based upon and claims the benefit of priority from Japanese Patent Application No. 2021-045127, filed on Mar. 18, 2021, the entire contents of which are incorporated herein by reference.

FIELD

Embodiments described herein relate generally to a semiconductor device, a semiconductor device manufacturing method, an inverter circuit, a drive device, a vehicle, and an elevator.

BACKGROUND

Silicon carbide (SiC) is expected as a material for next-generation semiconductor devices. Silicon carbide has excellent physical properties, such as a bandgap of 3 times that of silicon (Si), a breakdown field strength of about 10 times that of silicon, and a thermal conductivity of about 3 times that of silicon. By using such characteristics, it is possible to realize a semiconductor device that can operate at high temperature with low loss.

For example, when a metal oxide semiconductor field effect transistor (MOSFET) is formed using silicon carbide, there is a risk that the reliability of the gate insulating layer will decrease or the mobility of carriers will decrease. The decrease in reliability of the gate insulating layer or the decrease in mobility of carriers is caused by, for example, the interface state between the silicon carbide layer and the gate insulating layer.

BRIEF DESCRIPTION OF THE DRAWINGS

FIGS. 4A, 4B, and 4C are diagrams showing the surface structure of a 4H—SiC semiconductor;

FIGS. 21A, 21B, and 21C are explanatory diagrams of the function and effect of the semiconductor device of the first embodiment;

DETAILED DESCRIPTION

Figure 1:
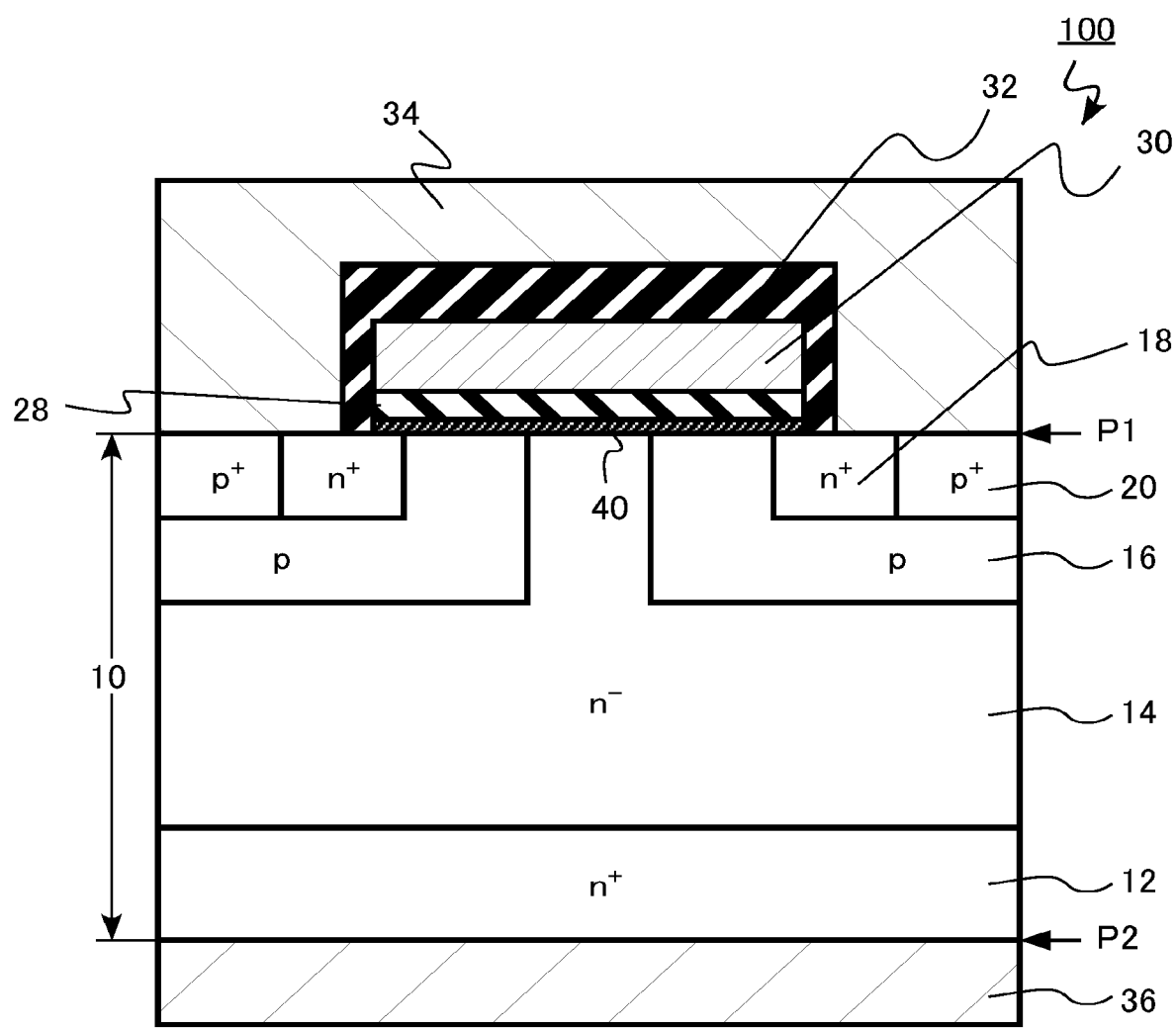
FIG. 1 is a schematic cross-sectional view of a semiconductor device of a first embodiment.

A semiconductor device of embodiments includes: a silicon carbide layer having a first face having an off-angle of 0° or more and 8° or less with respect to a {0001} face and a second face opposite to the first face, the silicon carbide layer having a 4H—SiC crystal structure, the silicon carbide layer including a p-type silicon carbide region in contact with the first face, the silicon carbide layer including a first layer, a second layer, a third layer, a fourth layer, and a fifth layer, the first layer, the second layer, the third layer, the fourth layer, and the fifth layer disposed from the first face towards the second face in this order, the first layer being an uppermost layer in the silicon carbide layer and in contact with the first face, a percentage of a first silicon atom among a plurality of silicon atoms present in the first layer being equal to or more than 90%, the first silicon atom being a silicon atom occupying a site position different from a site position occupied by a silicon atom in the third layer below the first silicon atom and occupying a site position the same as a site position occupied by a silicon atom in the fifth layer below the first silicon atom; a gate electrode; a silicon oxide layer disposed between the silicon carbide layer and the gate electrode; and a region disposed between the silicon carbide layer and the silicon oxide layer and having a nitrogen concentration of $1 \times 10^{21}$ cm$^{-3}$ or more.

Hereinafter, embodiments will be described with reference to the diagrams. In the following description, the same or similar members and the like are denoted by the same reference numerals, and the description of the members and the like once described will be omitted as appropriate.

In addition, in the following description, when there are notations of n$^+$, n, n$^-$, p$^+$, p, and p$^-$, these indicate the relative high and low of the impurity concentration in each conductive type. That is, n$^+$ indicates that the n-type impurity concentration is relatively higher than n, and n$^-$ indicates that the n-type impurity concentration is relatively lower than n. In addition, indicates that the p-type impurity concentration is relatively higher than p, and p$^-$ indicates that the p-type impurity concentration is relatively lower than p. In addition, n$^+$-type and n$^-$-type may be simply described as n-type, p$^+$-type and p$^-$-type may be simply described as p-type. Unless otherwise specified, the impurity concentration in each region is represented by, for example, the value of the impurity concentration in the central portion of each region.

The impurity concentration can be measured by, for example, secondary ion mass spectrometry (SIMS). In addition, the relative high and low of the impurity concentration can be determined from, for example, the high and low of the carrier concentration obtained by scanning capacitance microscopy (SCM). In addition, the distance such as the width or depth of an impurity region can be calculated from, for example, SIMS. In addition, the distance such as the width or depth of an impurity region can be calculated from, for example, an SCM image.

The depth of a trench, the thickness of an insulating layer, and the like can be measured, for example, on the profile of SIMS or the image of a transmission electron microscope (TEM) or by a scanning electron microscope (SEM).

In addition, the bonding states of silicon atoms, carbon atoms, nitrogen atoms, and oxygen atoms in the silicon carbide layer can be identified by using, for example, X-ray photoelectron spectroscopy (XPS method). In addition, the concentrations of various bonding states and the magnitude relationship between the concentrations can be determined by using, for example, X-ray photoelectron spectroscopy (XPS method).

The surface structure of the silicon carbide layer can be observed by using, for example, a TEM image. For example, the arrangement of atoms on the surface of the silicon carbide layer can be analyzed by using a TEM image. In addition, the surface structure of the silicon carbide layer can be analyzed by, for example, scanning tunneling spectroscopy (STS method).

First Embodiment

A semiconductor device of a first embodiment includes: a silicon carbide layer having a first face having an off-angle of 0° or more and 8° or less with respect to a {0001} face and a second face opposite to the first face, the silicon carbide layer having a 4H—SiC crystal structure, the silicon carbide layer including a p-type silicon carbide region in contact with the first face, the silicon carbide layer including a first layer, a second layer, a third layer, a fourth layer, and a fifth layer, the first layer, the second layer, the third layer, the fourth layer, and the fifth layer disposed from the first face towards the second face in this order, the first layer being an uppermost layer in the silicon carbide layer and in contact with the first face, a percentage of a first silicon atom among a plurality of silicon atoms present in the first layer being equal to or more than 90%, the first silicon atom being a silicon atom occupying a site position different from a site position occupied by a silicon atom in the third layer below the first silicon atom and occupying a site position the same as a site position occupied by a silicon atom in the fifth layer below the first silicon atom; a gate electrode; a silicon oxide layer disposed between the silicon carbide layer and the gate electrode; and a region disposed between the silicon carbide layer and the silicon oxide layer and having a nitrogen concentration of $1 \times 10^{21}$ cm$^{-3}$ or more.

FIG. 1 is a schematic cross-sectional view of the semiconductor device of the first embodiment. The semiconductor device is a MOSFET 100. The MOSFET 100 is a double implantation MOSFET (DIMOSFET) in which a p-well and a source region are formed by ion implantation. In addition, the MOSFET 100 is an n-channel MOSFET having electrons as carriers.

The MOSFET 100 includes a silicon carbide layer 10, a gate insulating layer 28 (silicon oxide layer), a gate electrode 30, an interlayer insulating film 32, a source electrode 34, a drain electrode 36, and an interface termination region 40 (region).

The silicon carbide layer 10 includes a drain region 12, a drift region 14, a p-well region 16 (silicon carbide region), a source region 18, and a p-well contact region 20.

The silicon carbide layer 10 is a single crystal SiC semiconductor. The silicon carbide layer 10 has a first face P1 and a second face P2 opposite to the first face P1. Hereinafter, the first face P1 may be referred to as a surface of the silicon carbide layer 10, and the second face P2 may be referred to as a back surface of the silicon carbide layer 10.

In this specification, the "depth" means a depth with respect to the first face P1.

The silicon carbide layer 10 is disposed between the source electrode 34 and the drain electrode 36. The source electrode 34 is provided on the first face P1 side of the silicon carbide layer 10. The drain electrode 36 is provided on the second face P2 side of the silicon carbide layer 10.

Figure 2:
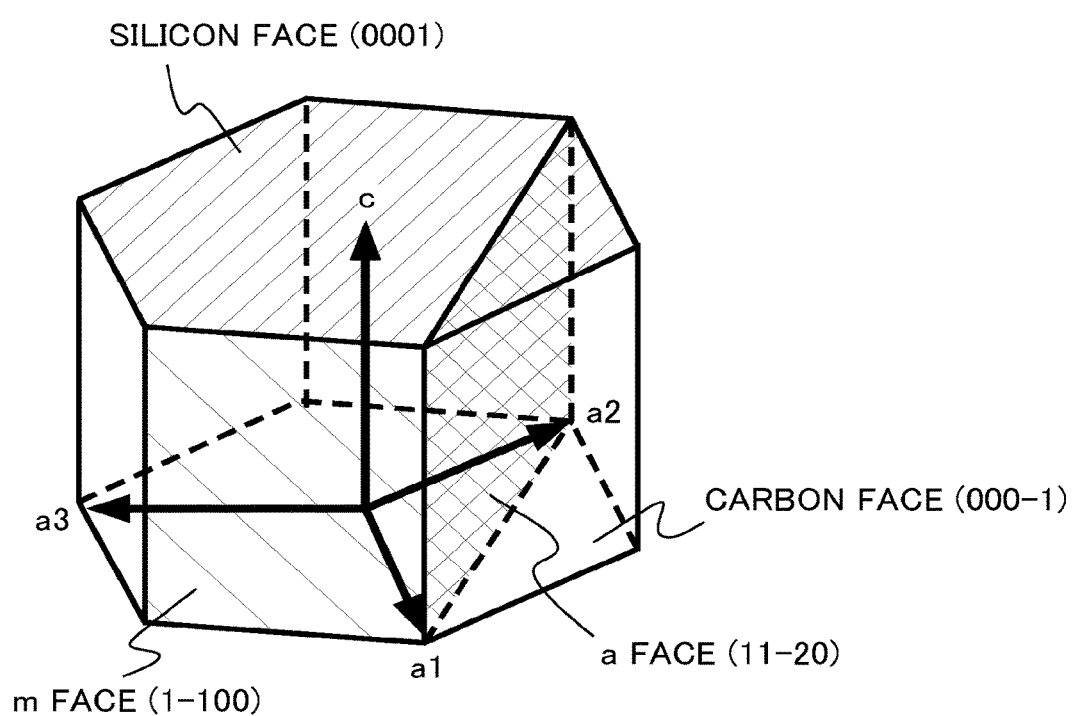
FIG. 2 is a diagram showing a crystal structure of a SiC semiconductor.

FIG. 2 is a diagram showing the crystal structure of a SiC semiconductor. A typical crystal structure of the SiC semiconductor is a hexagonal crystal system such as 4H—SiC. One of the faces (top faces of the hexagonal column) whose normal line is a c-axis along the axial direction of the hexagonal column is a (0001) face. The face equivalent to the (0001) face is referred to as a silicon face (Si face) and denoted as a {0001} face. Silicon atoms (Si) are arranged on the outermost surface of the silicon face.

The other side of the face (top face of the hexagonal column) whose normal line is the c-axis along the axial direction of the hexagonal column is a (000-1) face. The face equivalent to the (000-1) face is referred to as a carbon face (C face) and denoted as a {000-1} face. Carbon atoms (C) are arranged on the outermost surface of the carbon face.

The side face (pillar face) of the hexagonal column is an m face that is a face equivalent to the (1-100) face, that is, a {1-100} face. In addition, the face passing through a pair of ridge lines not adjacent to each other is an a face that is a face equivalent to the (11-20) face, that is, a {11-20} face.

Both silicon atoms (Si) and carbon atoms (C) are arranged on the outermost surfaces of the m face and the a face.

The silicon carbide layer 10 has a 4H—SiC crystal structure. The first face P1 of the silicon carbide layer 10 has an off-angle of 0° or more and 8° or less with respect to the {0001} face. The first face P1 is a face inclined by an angle of 0° or more and 8° or less with respect to the silicon face, and the second face P2 is a face inclined by an angle of 0° or more and 8° or less with respect to the carbon face.

Figure 3:
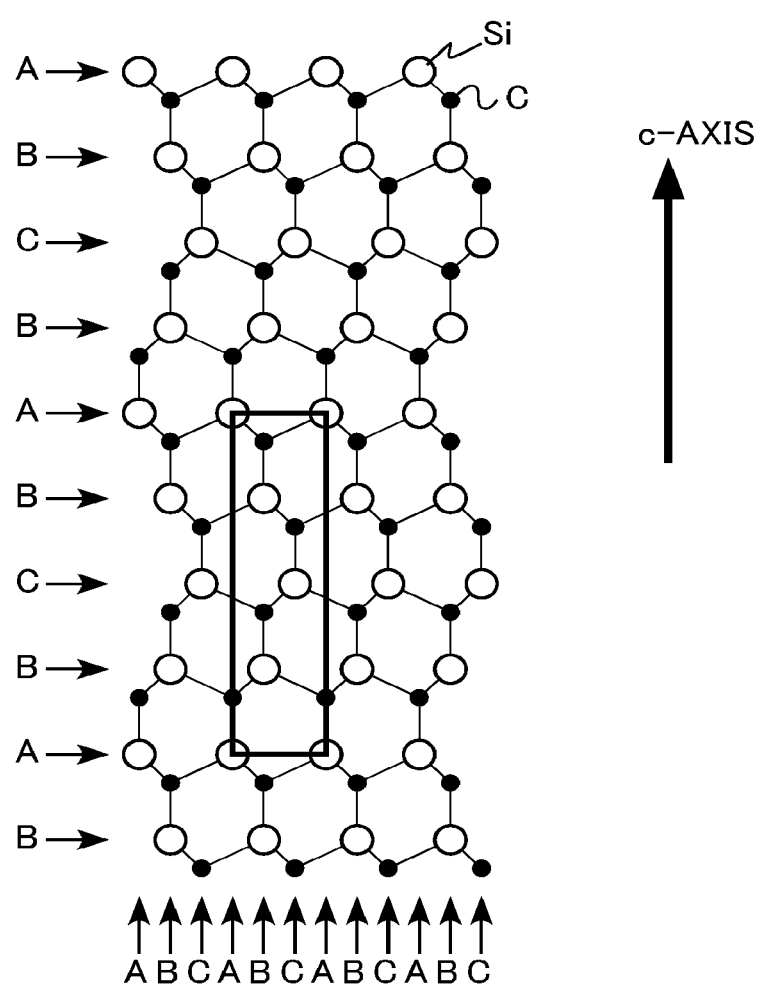
FIG. 3 is a diagram showing a crystal structure of a 4H—SiC semiconductor.

FIG. 3 is a diagram showing a crystal structure of a 4H—SiC semiconductor. FIG. 3 shows the arrangement of silicon atoms and carbon atoms of a 4H—SiC semiconductor.

In FIG. 3, silicon atoms are expressed by white circles and carbon atoms are expressed by black circles. The region surrounded by a square is a 4H—SiC unit cell. The 4H—SiC is configured by repeatedly arranging the unit cells.

The 4H—SiC contains four silicon atomic layers in one cycle in the stacking direction (c-axis direction). As the site position occupied by a silicon atom, there are three site positions. Three site positions are A site, B site, and C site.

FIGS. 4A, 4B, and 4C are diagrams showing the surface structure of a 4H—SiC semiconductor. FIGS. 4A, 4B, and 4C are explanatory diagrams of a surface structure that can be formed on the surface of the 4H—SiC semiconductor. FIGS. 4A, 4B, and 4C are explanatory diagrams of the surface structure that can be formed on the first face P1 side of the silicon carbide layer 10. FIG. 4A shows a first surface structure, FIG. 4B shows a second surface structure, and FIG. 4C shows a third surface structure. Each of the first to fifth layers shown in FIGS. 4A, 4B, and 4C includes an upper silicon atomic layer and a lower carbon atomic layer. The first layer, the second layer, the third layer, the fourth layer, and the fifth layer disposed from the first face P1 towards the second face P2 in this order. The first layer is an uppermost layer in the silicon carbide layer 10 and in contact with the first face P1.

The silicon atom disposed in the first layer of the outermost surface of the first surface structure shown in FIG. 4A is the first silicon atom. The site position occupied by the first silicon atom is different from the site position occupied by a silicon atom in the third layer below the first silicon atom, and is the same as the site position occupied by a silicon atom in the fifth layer below the first silicon atom.

In the first surface structure, the site position occupied by the first silicon atom disposed in the first layer is the A site. The site position occupied by the silicon atom in the third layer is the C site. The site position occupied by the silicon atom in the fifth layer is the A site. Therefore, the site position occupied by the first silicon atom is different from the site position occupied by the silicon atom in the third layer, and is the same as the site position occupied by the silicon atom in the fifth layer.

The silicon atom disposed in the first layer of the outermost surface of the second surface structure shown in FIG. 4B is the second silicon atom. The site position occupied by the second silicon atom is the same as the site position occupied by a silicon atom in the third layer below the second silicon atom, and is the same as the site position occupied by a silicon atom in the fifth layer below the second silicon atom.

In the second surface structure, the site position occupied by the second silicon atom disposed in the first layer is the B site. The site position occupied by the silicon atom in the third layer is the B site. The site position occupied by the silicon atom in the fifth layer is the B site. Therefore, the site position occupied by the second silicon atom is the same as the site position occupied by the silicon atom in the third layer, and is the same as the site position occupied by the silicon atom in the fifth layer.

The silicon atom disposed in the first layer of the outermost surface of the third surface structure shown in FIG. 4C is the third silicon atom. The site position occupied by the third silicon atom is different from the site position occupied by a silicon atom in the third layer below the third silicon atom, and is also different from the site position occupied by a silicon atom in the fifth layer below the third silicon atom.

In the third surface structure, the site position occupied by the third silicon atom disposed in the first layer is the A site. The site position occupied by the silicon atom in the third layer is the B site. The site position occupied by the silicon atom in the fifth layer is the B site. Therefore, the site position of the third silicon atom is different from the site position occupied by the silicon atom in the third layer from, and is also different from the site position occupied by the silicon atom in the fifth layer. In the third surface structure, the periodicity of the first layer of the outermost surface is broken.

The drain region 12 is an n$^+$-type SiC. The drain region 12 contains, for example, nitrogen (N) as an n-type impurity. The n-type impurity concentration in the drain region 12 is, for example, equal to or more than $1\times10^{18}$ cm$^{-3}$ and equal to or less than $1\times10^{21}$ cm$^{-3}$.

The drift region 14 is provided on the drain region 12. The drift region 14 is an n$^-$-type SiC. The drift region 14 contains, for example, nitrogen as an n-type impurity.

The n-type impurity concentration in the drift region 14 is lower than the n-type impurity concentration in the drain region 12. The n-type impurity concentration in the drift region 14 is, for example, equal to or more than $1\times10^{15}$ cm$^{-3}$ and equal to or less than $2\times10^{16}$ cm$^{-3}$. The drift region 14 is, for example, a SiC epitaxial growth layer formed on the drain region 12 by an epitaxial growth method.

The thickness of the drift region 14 is, for example, equal to or more than 5 μm and equal to or less than 100 μm.

The p-well region 16 is provided on a partial surface of the drift region 14. The p-well region 16 is disposed between the drift region 14 and the gate insulating layer 28. The p-well region 16 is in contact with the first face P1. The p-well region 16 is a p-type SiC.

The p-well region 16 contains, for example, aluminum (Al) as a p-type impurity. The p-type impurity concentration in the p-well region 16 is, for example, equal to or more than $1\times10^{16}$ cm$^{-3}$ and equal to or less than $1\times10^{20}$ cm$^{-3}$.

The depth of the p-well region 16 is, for example, equal to or more than 0.4 μm and equal to or less than 0.8 μm. The p-well region 16 functions as a channel region of the MOSFET 100.

The source region 18 is provided on a partial surface of the p-well region 16. The source region 18 is, an n$^+$-type SiC. The source region 18 contains, for example, phosphorus (P) as an n-type impurity. The n-type impurity concentration in the source region 18 is, for example, equal to or more than $1\times10^{18}$ cm$^{-3}$ and equal to or less than $1\times10^{22}$ cm$^{-3}$.

The depth of the source region 18 is smaller than the depth of the p-well region 16. The depth of the source region 18 is, for example, equal to or more than 0.2 μm and equal to or less than 0.4 μm.

The p-well contact region 20 is provided on a partial surface of the p-well region 16. The p-well contact region 20 is provided on the side of the source region 18. The p-well contact region 20 is a p$^+$-type SiC.

The p-well contact region 20 contains, for example, aluminum as a p-type impurity. The p-type impurity concentration in the p-well contact region 20 is, for example, equal to or more than $1\times10^{18}$ cm$^{-3}$ and equal to or less than $1\times10^{22}$ cm$^{-3}$.

The depth of the p-well contact region 20 is smaller than the depth of the p-well region 16. The depth of the p-well contact region 20 is, for example, equal to or more than 0.2 μm and equal to or less than 0.4 μm.

The gate insulating layer 28 is provided between the silicon carbide layer 10 and the gate electrode 30. The gate insulating layer 28 is provided between the drift region 14 and the gate electrode 30 and between the p-well region 16 and the gate electrode 30. The gate insulating layer 28 is provided above the drift region 14 and the p-well region 16. The gate insulating layer 28 is continuously formed on the surfaces of the drift region 14 and the p-well region 16.

The gate insulating layer 28 contains silicon oxide. The gate insulating layer 28 is an example of a silicon oxide layer.

The thickness of the gate insulating layer 28 is, for example, equal to or more than 30 nm and equal to or less than 100 nm. The gate insulating layer 28 functions as a gate insulating layer of the MOSFET 100.

The interface termination region 40 is disposed between the silicon carbide layer 10 and the gate insulating layer 28. The interface termination region 40 is disposed between the drift region 14 and the gate insulating layer 28 and between the p-well region 16 and the gate insulating layer 28. The interface termination region 40 contains nitrogen (N) as a termination element for terminating the dangling bond of the silicon carbide layer 10. The interface termination region 40 is an example of a region.

The concentration of nitrogen in the interface termination region 40 is equal to or more than $1\times10^{21}$ cm$^{-3}$. The concentration of nitrogen in the interface termination region 40 is, for example, equal to or more than $1\times10^{22}$ cm$^{-3}$.

Figure 5:
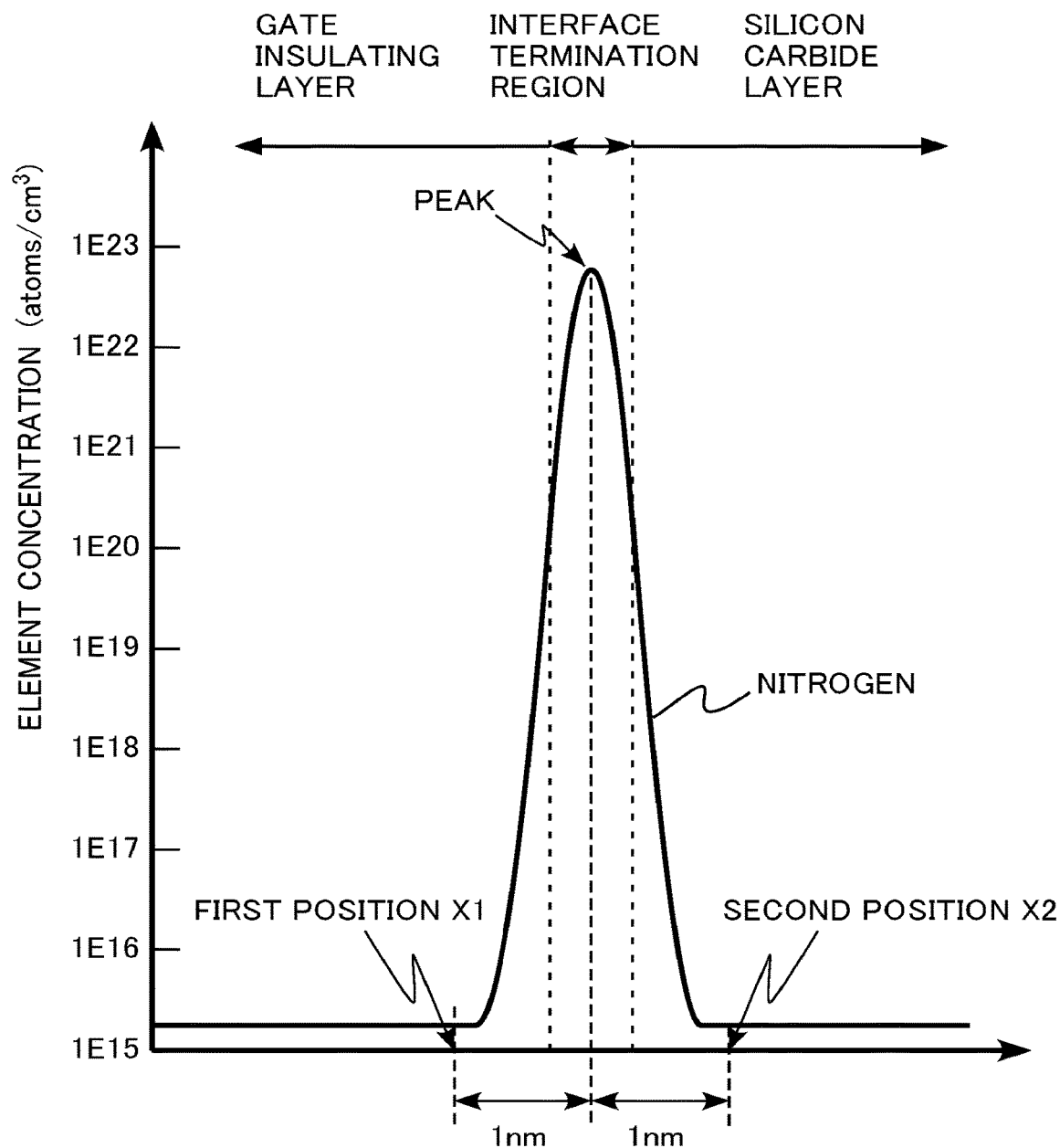
FIG. 5 is a diagram showing the element concentration distribution of the semiconductor device of the first embodiment.

FIG. 5 is a diagram showing the element concentration distribution of the semiconductor device of the first embodiment. FIG. 5 is a diagram showing the element concentration distribution in the gate insulating layer 28, the interface termination region 40, and the silicon carbide layer 10. FIG. 5 shows the concentration distribution of nitrogen.

The nitrogen concentration distribution has a peak in the interface termination region 40. The peak nitrogen concentration is, for example, equal to or more than $1\times10^{21}$ cm$^{-3}$ and equal to or less than $4\times10^{23}$ cm$^{-3}$. The nitrogen concentration at the peak of the nitrogen concentration distribution is, for example, equal to or more than $1\times10^{21}$ cm$^{-3}$.

The full width at half maximum with respect to the peak of the nitrogen concentration distribution is, for example, equal to or less than 1 nm. Nitrogen is segregated at the interface between the silicon carbide layer 10 and the gate insulating layer 28.

The nitrogen concentration at a first position (X1 in FIG. 5) 1 nm away from the peak of the nitrogen concentration distribution toward the gate insulating layer 28 is equal to or less than $1\times10^{18}$ cm$^{-3}$. The nitrogen concentration at a second position (X2 in FIG. 5) 1 nm away from the peak of the nitrogen concentration distribution toward the silicon carbide layer 10 is equal to or less than $1\times10^{18}$ cm$^{-3}$.

Figure 6A:
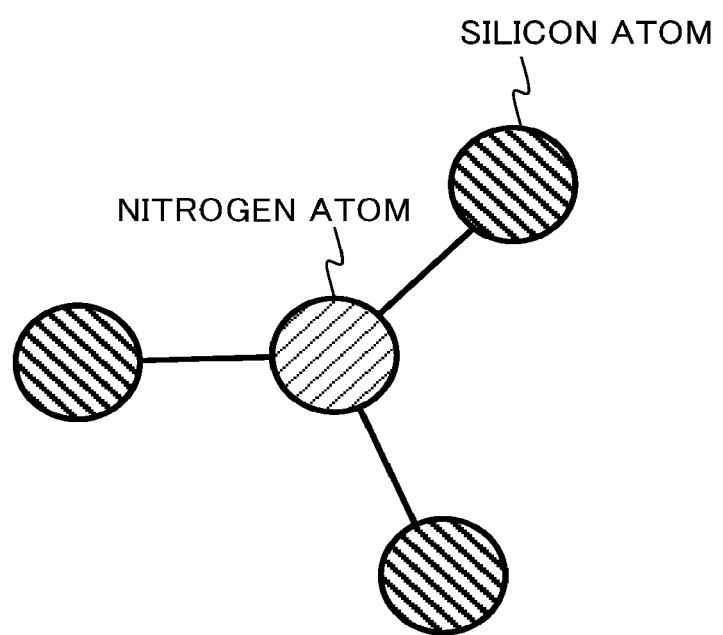
FIGS. 6A and 6B are schematic diagrams showing the bonding state of nitrogen atoms in the semiconductor device of the first embodiment.
Figure 6B:
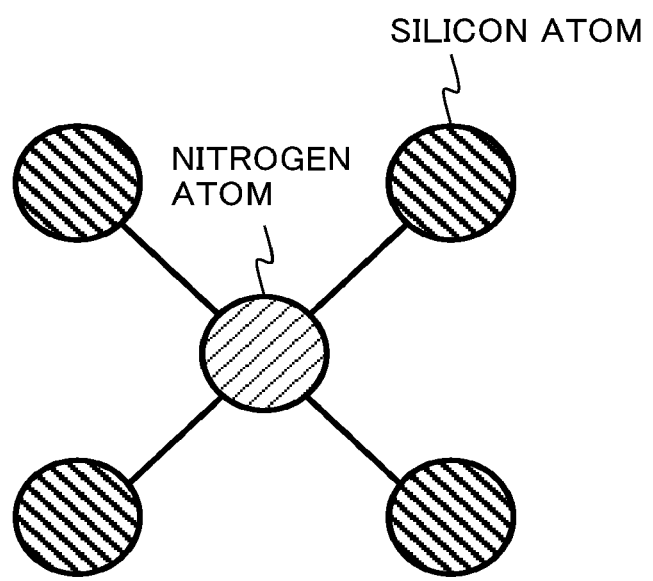

FIGS. 6A and 6B are schematic diagrams showing the bonding state of nitrogen atoms in the semiconductor device of the first embodiment. FIG. 6A shows a case of three-coordinated nitrogen atom, and FIG. 6B shows a case of four-coordinated nitrogen atom.

In the case of the three-coordinated nitrogen atom shown in FIG. 6A, the nitrogen atom is bonded to three silicon atoms. In the case of the four-coordinated nitrogen atom shown in FIG. 6B, the nitrogen atom is bonded to four silicon atoms.

In the interface termination region 40, the concentration of nitrogen atoms bonded to three silicon atoms is higher than the concentration of nitrogen atoms bonded to four silicon atoms. In other words, in the interface termination region 40, the concentration of three-coordinated nitrogen atoms is higher than the concentration of four-coordinated nitrogen atoms.

For example, 90% or more of the nitrogen atoms present in the interface termination region 40 are three-coordinated nitrogen atoms. The concentration of three-coordinated nitrogen atoms is, for example, equal to or more than $1\times10^{21}$ cm$^{-3}$.

The three-coordinated nitrogen atoms present in the interface termination region 40 terminate the dangling bonds on the surface of the silicon carbide layer 10.

The nitrogen atom in the interface termination region 40 substitutes the carbon atom in the uppermost layer of the silicon carbide layer 10. The nitrogen atom in the interface termination region 40 is tri-coordinated with the silicon carbide layer 10. The nitrogen atom is present at the position of the carbon atom in the crystal structure of silicon carbide. The silicon atoms of the silicon carbide layer 10 are tri-coordinated with the nitrogen atom.

The nitrogen atom in the interface termination region 40 substitutes the carbon atom of the bilayer forming the uppermost layer of the silicon carbide layer 10. The nitrogen atom is finally tri-coordinated with the silicon carbide layer 10. Excess silicon atoms or carbon atoms are released from the silicon carbide layer 10 to the gate insulating layer 28 side. The nitrogen atom is present at the position of the carbon atom in the crystal structure of silicon carbide. Some of the silicon atoms on the outermost surface enter the gate insulating layer 28, and the nitrogen atom is tri-coordinated with the silicon atoms of the silicon carbide layer 10.

The nitrogen atom present in the bulk of the silicon carbide layer 10 and substituting the carbon site of the crystal structure of silicon carbide is a four-coordinated nitrogen atom. Since the four-coordinated nitrogen atom functions as an n-type dopant, the threshold voltage of the MOSFET is reduced.

The concentration of nitrogen atoms bonded to four silicon atoms at the second position X2 is equal to or less than $1\times10^{18}$ cm$^{-3}$. In other words, the concentration of four-coordinated nitrogen atoms at the second position X2 is equal to or less than $1\times10^{18}$ cm$^{-3}$.

Figure 7:
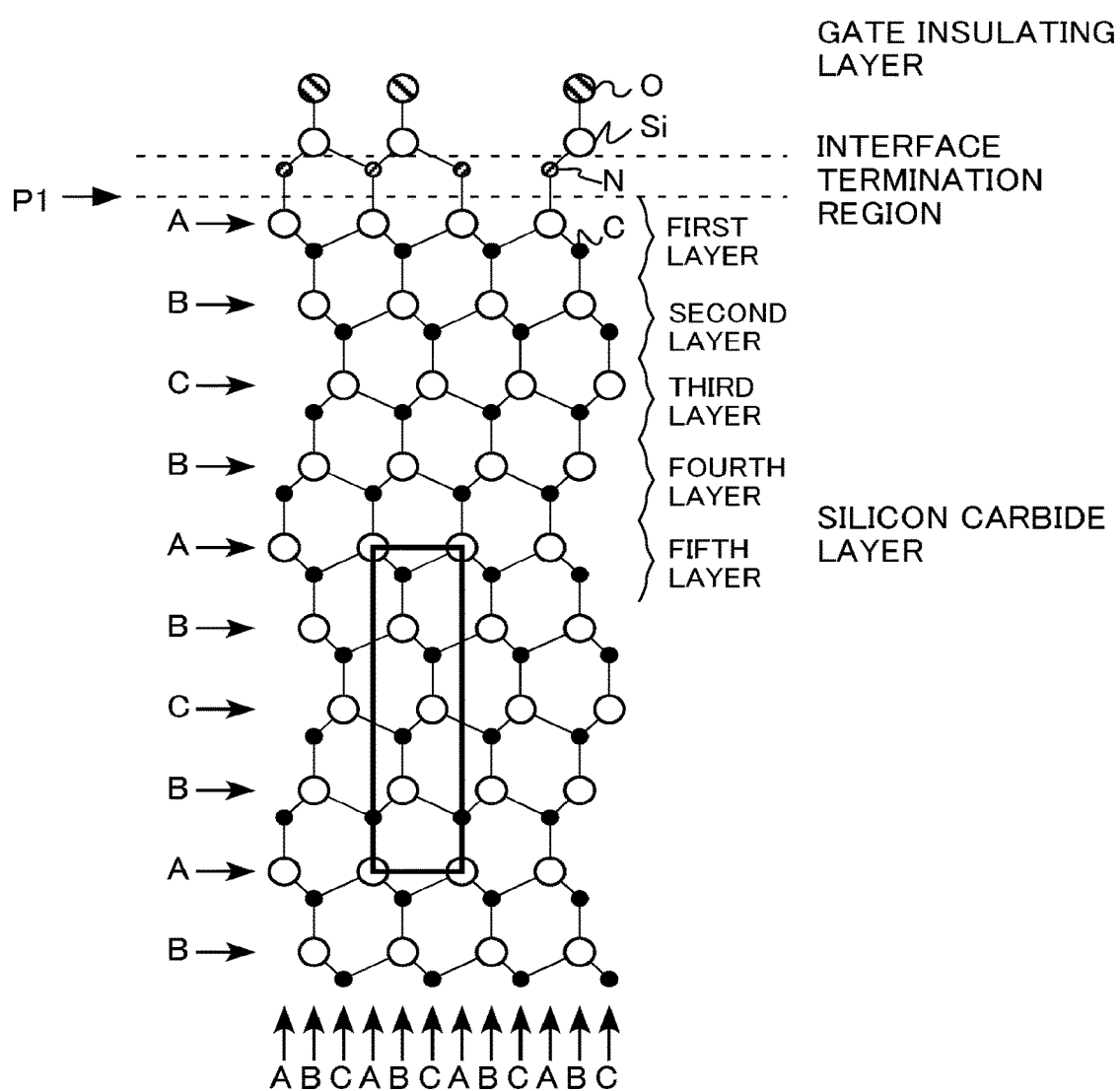
FIG. 7 is an explanatory diagram of the surface structure of a silicon carbide layer of the semiconductor device of the first embodiment.

FIG. 7 is an explanatory diagram of the surface structure of the silicon carbide layer of the semiconductor device of the first embodiment. FIG. 7 shows the arrangement of atoms in the silicon carbide layer 10, the interface termination region 40, and the gate insulating layer 28.

The first face P1 of the silicon carbide layer 10 has a first surface structure. A first silicon atom is present in the first layer, which is an uppermost layer of the silicon carbide layer 10.

The first silicon atom is bonded to the nitrogen atom in the interface termination region 40. The nitrogen atom in the interface termination region 40 is bonded to the silicon atom in the gate insulating layer 28. The silicon atom in the gate insulating layer 28 is bonded to the oxygen atom in the gate insulating layer 28.

The percentage of the first silicon atom among a plurality of silicon atoms present in the first layer, which is an uppermost layer of the silicon carbide layer 10, is equal to or more than 90%. The first face P1 of the silicon carbide layer 10 has the first surface structure as a main surface structure.

Among the plurality of silicon atoms present in the first layer that is an uppermost layer of the silicon carbide layer 10, silicon atoms other than the first silicon atom may include, for example, the second silicon atom or the third silicon atom. The first face P1 of the silicon carbide layer 10 may include, for example, the second surface structure or the third surface structure.

The gate electrode 30 is provided on the gate insulating layer 28. The gate insulating layer 28 is interposed between the gate electrode 30 and the silicon carbide layer 10. The gate insulating layer 28 is interposed between the gate electrode 30 and the drift region 14. The gate insulating layer 28 is interposed between the gate electrode 30 and the p-well region 16.

The gate electrode 30 is, for example, polycrystalline silicon containing n-type impurities or p-type impurities.

The interlayer insulating film 32 is formed on the gate electrode 30. The interlayer insulating film 32 is disposed between the gate electrode 30 and the source electrode 34. The interlayer insulating film 32 is, for example, a silicon oxide film.

The source electrode 34 is electrically connected to the source region 18 and the p-well contact region 20. The source electrode 34 also functions as a p-well electrode for applying an electric potential to the p-well region 16. The source electrode 34 is in contact with, for example, the source region 18 and the p-well contact region 20.

The source electrode 34 has, for example, a stacked structure of a barrier metal layer of nickel (Ni) and a metal layer of aluminum on the barrier metal layer. The barrier metal layer formed of nickel and the silicon carbide layer may react with each other to form nickel silicide (NiSi, $Ni_2Si$, and the like). The barrier metal layer formed of nickel and the metal layer formed of aluminum may form an alloy by reaction.

The drain electrode 36 is provided on a side of the silicon carbide layer 10 opposite to the source electrode 34, that is, on the back surface side of the silicon carbide layer 10. The drain electrode 36 is electrically connected to the drain region 12. The drain electrode 36 is in contact with, for example, the drain region 12.

The drain electrode 36 is, for example, nickel. Nickel may react with the drain region 12 to form nickel silicide (NiSi, $Ni_2Si$, and the like).

In addition, in the first embodiment, the n-type impurity is, for example, nitrogen or phosphorus. Arsenic (As) or antimony (Sb) can also be applied as an n-type impurity.

In addition, in the first embodiment, the p-type impurity is, for example, aluminum. Boron (B), gallium (Ga), and indium (In) can also be applied as p-type impurities.

Next, an example of a method for manufacturing the semiconductor device of the first embodiment will be described.

The method for manufacturing the semiconductor device of the first embodiment includes: performing first ion implantation to implant aluminum (Al) into a silicon carbide layer with a surface having an off-angle of 0° or more and 8° or less with respect to a {0001} face, the first ion implantation being performed with a first projected range and with a first dose amount; performing second ion implantation to implant carbon (C) into the silicon carbide layer with a second projected range and with a second dose amount, the second dose amount being equal to or more than 10 times the first dose amount; forming a carbon film on the silicon carbide layer; performing a first heat treatment at 1600° C. or higher; removing the carbon film; performing a second heat treatment at 1100° C. or higher in an atmosphere containing hydrogen; forming a silicon oxide film on the silicon carbide layer; performing a third heat treatment in an atmosphere containing nitrogen; and forming a gate electrode on the silicon oxide film.

Figure 8:
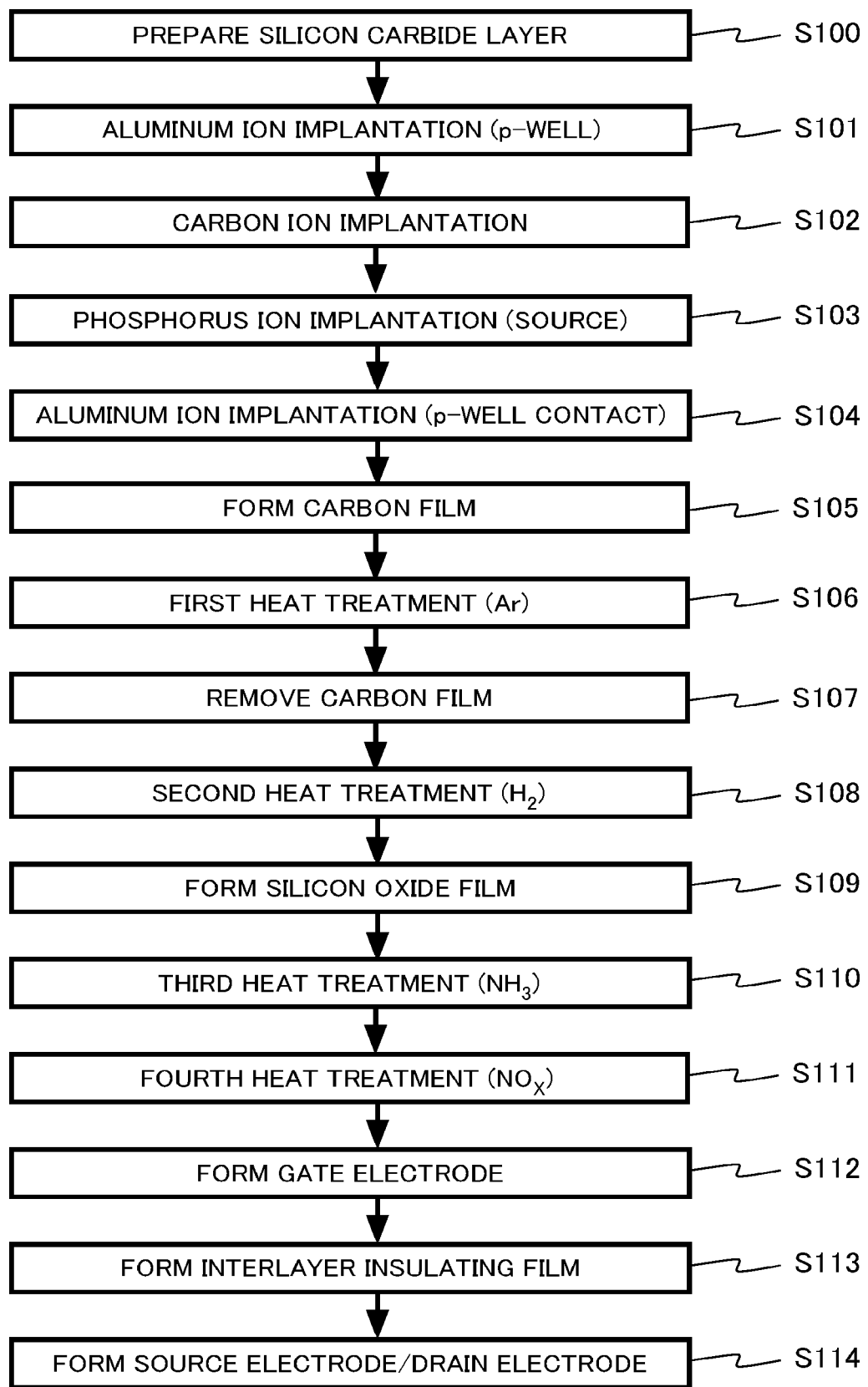
FIG. 8 is a process flow diagram of a method for manufacturing the semiconductor device of the first embodiment.

FIG. 8 is a process flow diagram of the method for manufacturing the semiconductor device of the first embodiment. FIGS. 9 to 20 are explanatory diagrams of the method for manufacturing the semiconductor device of the first embodiment. FIGS. 9 to 11 and FIGS. 13 to 20 are cross-sectional views during the manufacturing process. FIG. 12 is a diagram showing the element distribution immediately after ion implantation.

As shown in FIG. 8, the method for manufacturing the semiconductor device of the first embodiment includes silicon carbide layer preparation (step S100), aluminum ion implantation (step S101), carbon ion implantation (step S102), phosphorus ion implantation (step S103), aluminum ion implantation (step S104), carbon film formation (step S105), first heat treatment (step S106), carbon film removal (step S107), second heat treatment (step S108), silicon oxide film formation (step S109), third heat treatment (step S110), fourth heat treatment (step S111), gate electrode formation (step S112), interlayer insulating film formation (step S113), and source electrode/drain electrode formation (step S114).

Figure 9:
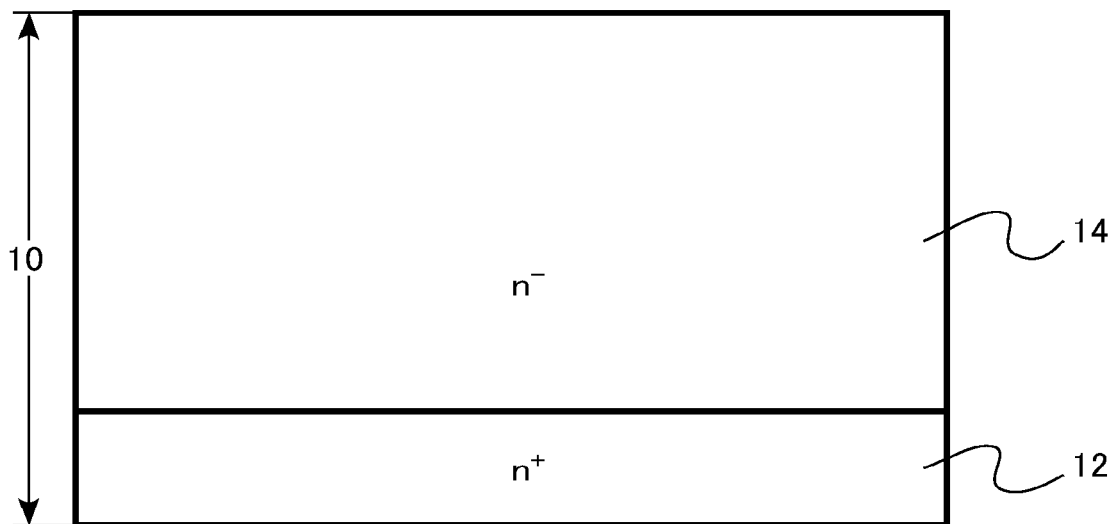
FIG. 9 is an explanatory diagram of the method for manufacturing the semiconductor device of the first embodiment.

In step S100, the silicon carbide layer 10 is prepared (FIG. 9). The silicon carbide layer 10 includes an $n^+$-type drain region 12 and an $n^-$-type drift region 14. The drift region 14 is formed, for example, on the drain region 12 by an epitaxial growth method.

The drain region 12 contains nitrogen as an n-type impurity. The n-type impurity concentration in the drain region 12 is, for example, equal to or more than $1 \times 10^{18}$ $cm^{-3}$ and equal to or less than $1 \times 10^{21}$ $cm^{-3}$.

The drift region 14 contains nitrogen as an n-type impurity. The n-type impurity concentration in the drift region 14 is, for example, equal to or more than $1 \times 10^{15}$ $cm^{-3}$ and equal to or less than $2 \times 10^{16}$ $cm^{-3}$. The thickness of the drift region 14 is, for example, equal to or more than 5 μm and equal to or less than 100 μm.

Figure 10:
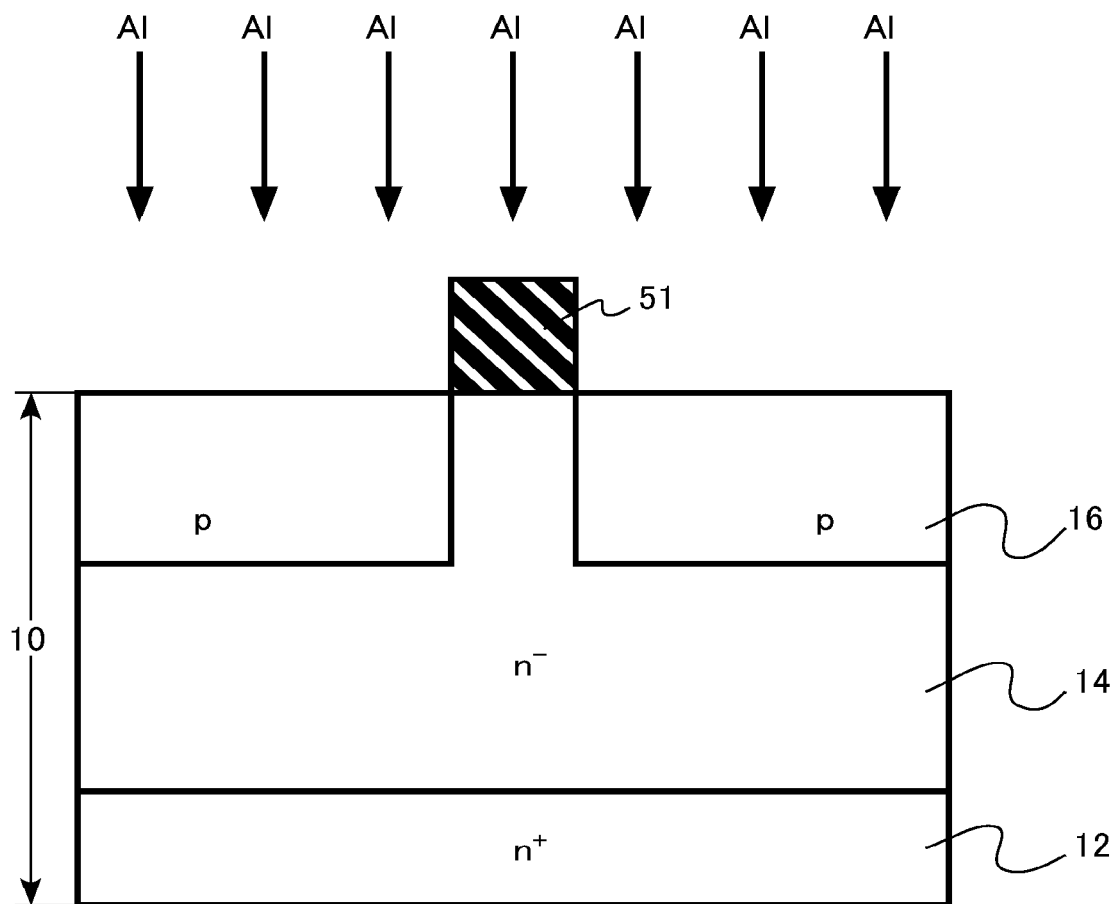
FIG. 10 is an explanatory diagram of the method for manufacturing the semiconductor device of the first embodiment.

In step S101, a first mask material 51 is formed, for example, by forming an insulating film and patterning the insulating film by photolithography and etching. Then, by using the first mask material 51 as an ion implantation mask, aluminum is ion-implanted into the drift region 14. The p-well region 16 is formed by ion implantation (FIG. 10).

Ion implantation for forming the p-well region 16 is an example of the first ion implantation. Aluminum ion implantation is performed with a first projected range and a first dose amount. The projected range is an average projected range.

The first projected range is, for example, equal to or more than 0.1 μm and equal to or less than 0.6 μm. The first dose amount is, for example, equal to or more than $1 \times 10^{12}$ $cm^{-2}$ and equal to or less than $1 \times 10^{14}$ $cm^{-2}$.

Figure 11:
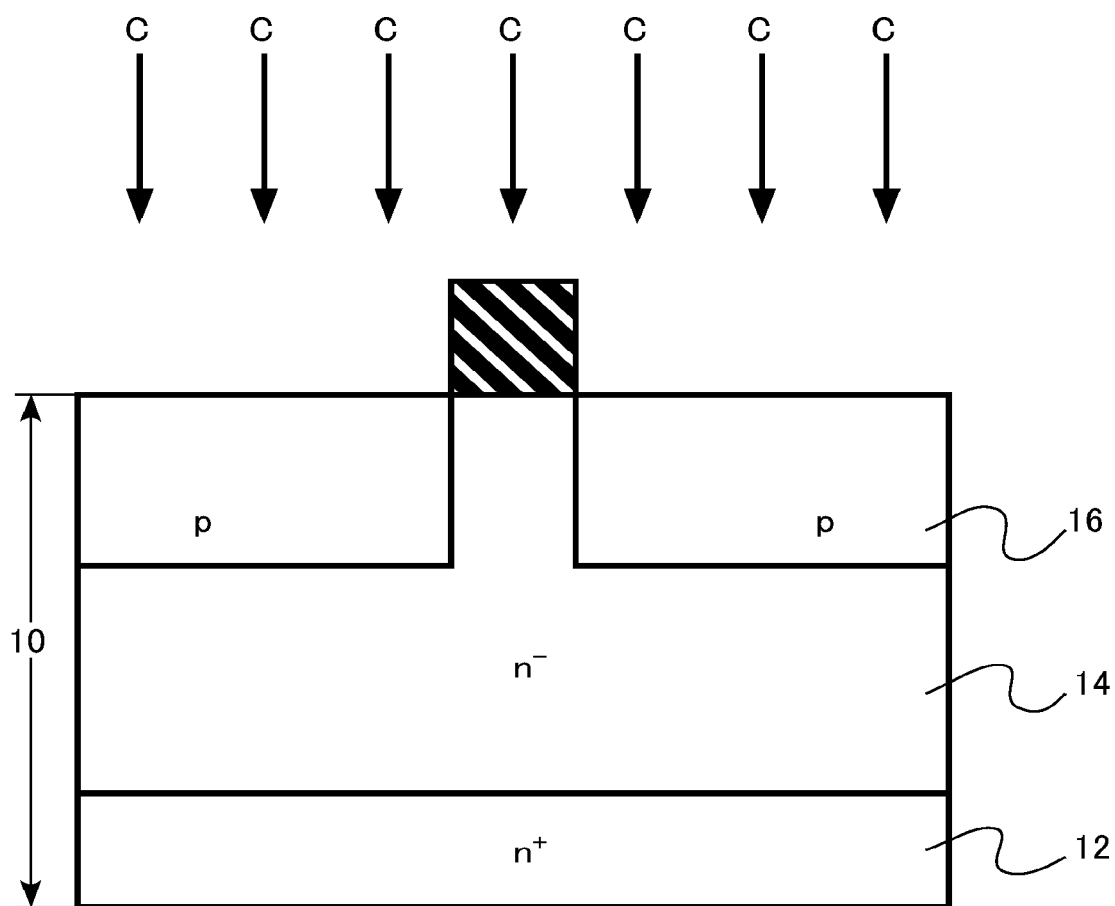
FIG. 11 is an explanatory diagram of the method for manufacturing the semiconductor device of the first embodiment.
Figure 12:
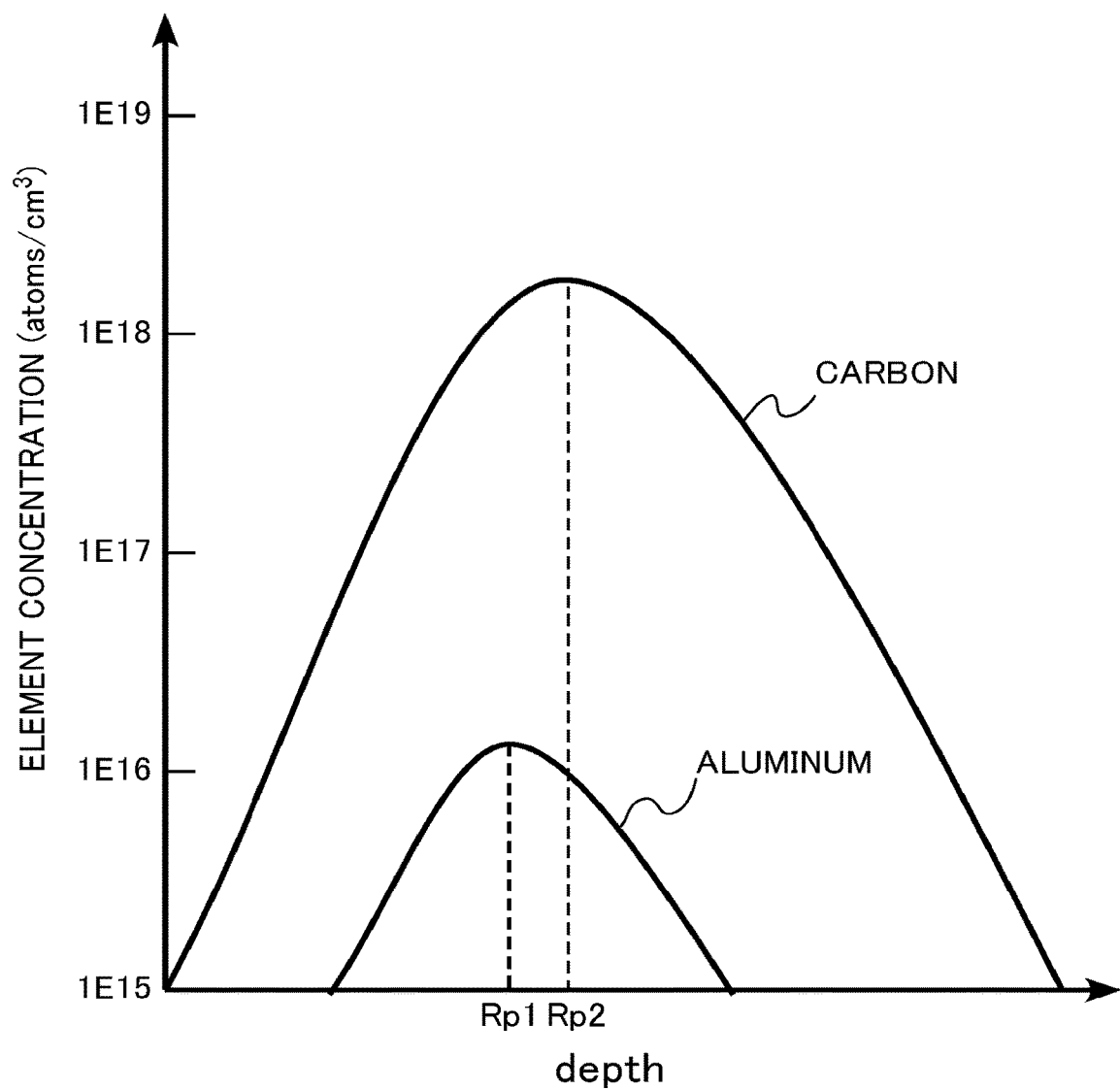
FIG. 12 is an explanatory diagram of the method for manufacturing the semiconductor device of the first embodiment.

In step S102, carbon is ion-implanted into the p-well region 16 by using the first mask material 51 as an ion implantation mask (FIG. 11). Carbon ion implantation into the p-well region 16 is an example of the second ion implantation. Carbon ion implantation is performed with a second projected range and a second dose amount. Thereafter, the first mask material 51 is removed.

The second projected range is, for example, equal to or more than 0.1 μm and equal to or less than 0.6 μm. The second projected range is, for example, equal to or more than 80% and equal to or less than 120% of the first projected range. The second dose amount is equal to or more than 10 times the first dose amount. The second dose amount is, for example, equal to or less than 1000 times the first dose amount. The second dose amount is, for example, equal to or more than $1\times10^{15}$ cm$^{-2}$ and equal to or less than $1\times10^{18}$ cm$^{-2}$.

FIG. 12 shows the concentration distribution of aluminum implanted into the silicon carbide layer 10 by the first ion implantation and the concentration distribution of carbon implanted into the silicon carbide layer 10 by the second ion implantation. FIG. 12 shows the element distribution immediately after ion implantation.

As shown in FIG. 12, a second projected range Rp2 for carbon ion implantation is disposed in the vicinity of the first projected range Rp1 for aluminum ion implantation. Since the second dose amount of carbon ion implantation is equal to or more than 10 times the first dose amount of aluminum ion implantation, the carbon concentration distribution after ion implantation completely covers, for example, the aluminum concentration distribution after ion implantation.

The peak concentration of the aluminum distribution is, for example, equal to or more than $1\times10^{16}$ cm$^{-3}$ and equal to or less than $1\times10^{20}$ cm$^{-3}$. The peak concentration of the carbon distribution is, for example, equal to or more than $1\times10^{18}$ cm$^{-3}$ and equal to or less than $1\times10^{22}$ cm$^{-3}$.

Figure 13:
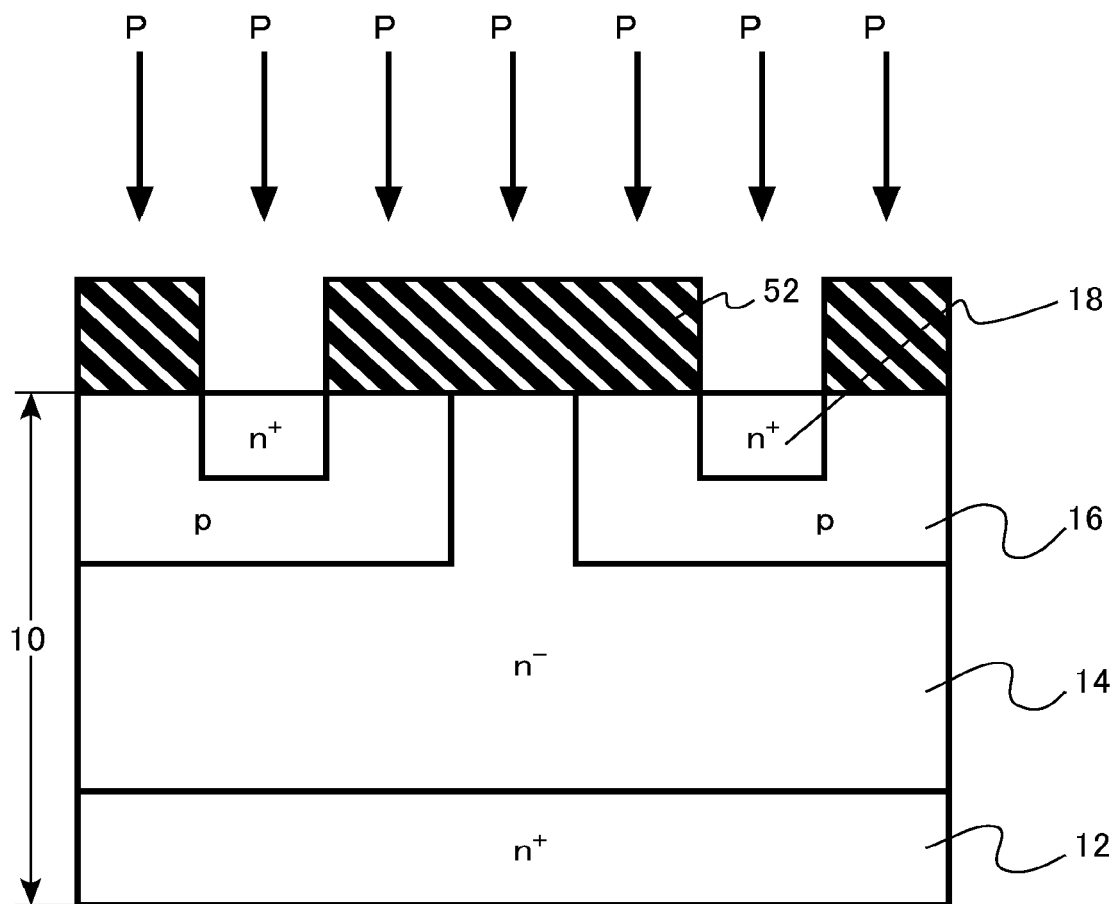
FIG. 13 is an explanatory diagram of the method for manufacturing the semiconductor device of the first embodiment.

In step S103, a second mask material 52 is formed, for example, by forming an insulating film and patterning the insulating film by photolithography and etching. Then, by using the second mask material 52 as an ion implantation mask, phosphorus is ion-implanted into the drift region 14 to form the source region 18 (FIG. 13). Thereafter, the second mask material 52 is removed.

Figure 14:
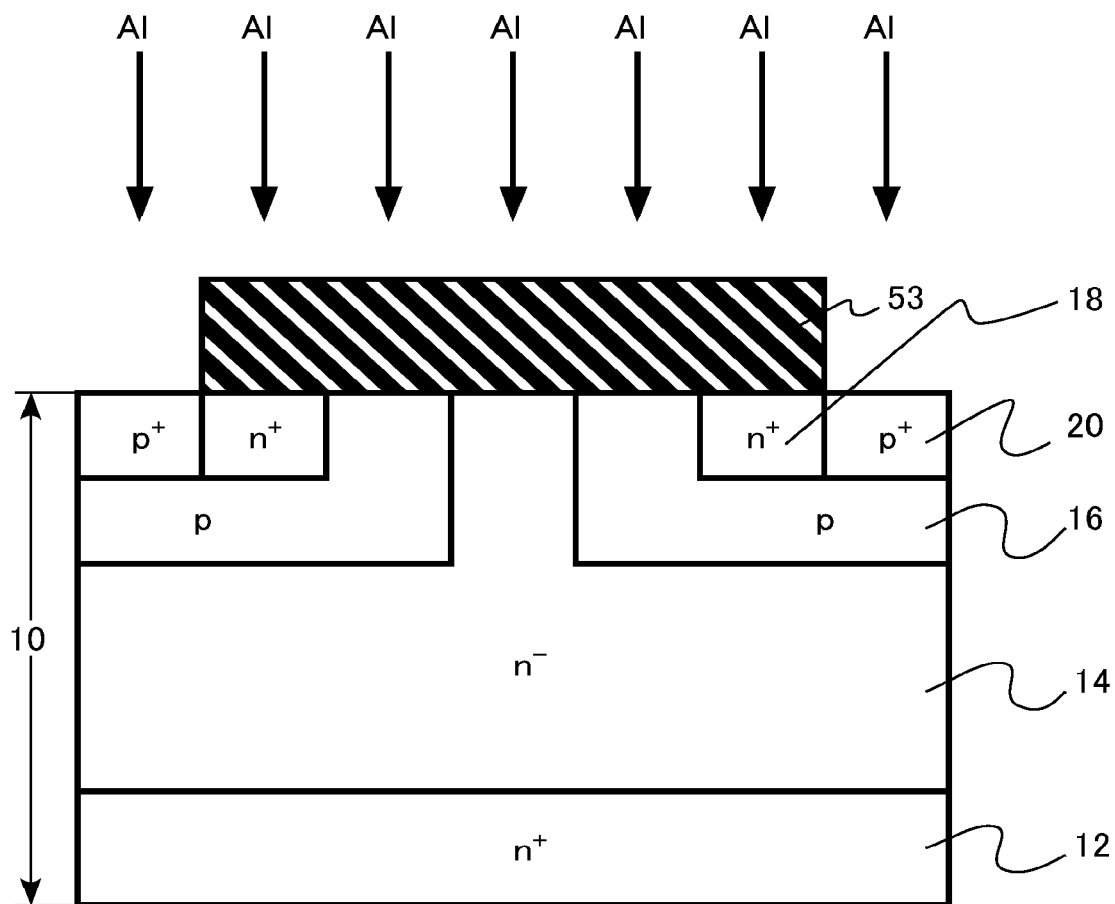
FIG. 14 is an explanatory diagram of the method for manufacturing the semiconductor device of the first embodiment.

In step S104, a third mask material 53 is formed, for example, by forming an insulating film and patterning the insulating film by photolithography and etching. By using the third mask material 53 as an ion implantation mask, aluminum is ion-implanted into the drift region 14 to form the p-well contact region 20 (FIG. 14).

Figure 15:
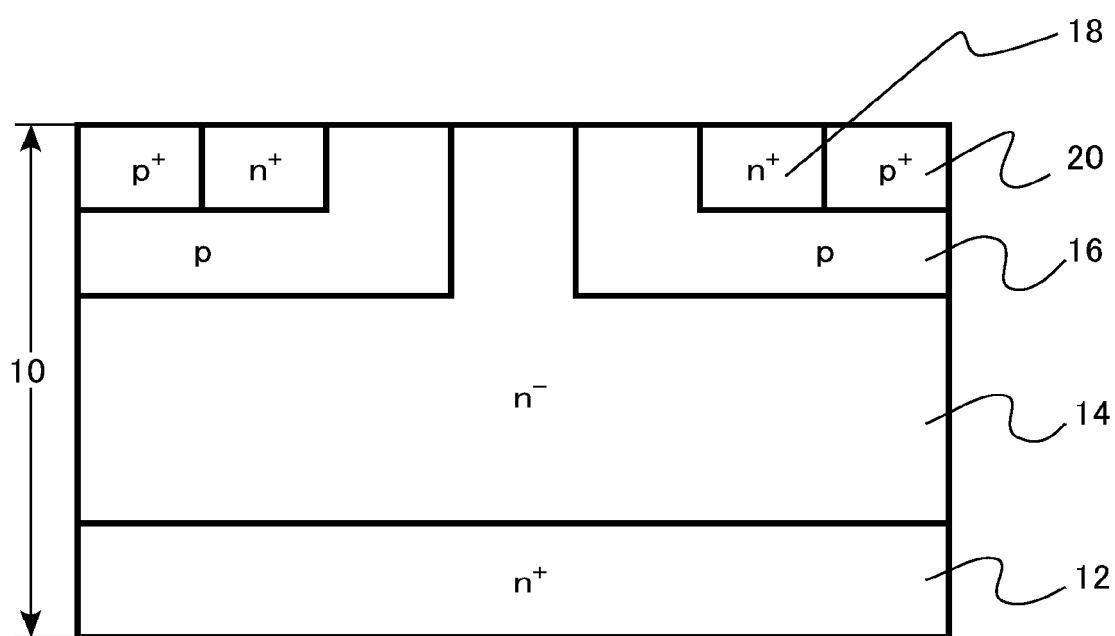
FIG. 15 is an explanatory diagram of the method for manufacturing the semiconductor device of the first embodiment.

Then, the third mask material 53 is removed (FIG. 15).

Figure 16:
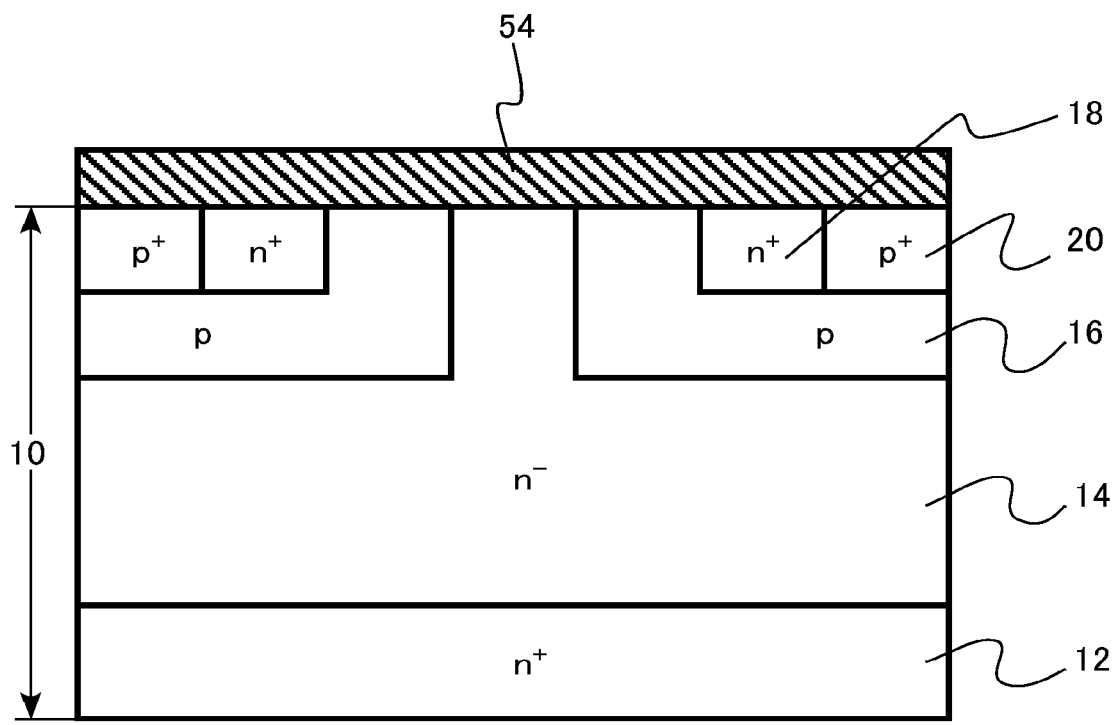
FIG. 16 is an explanatory diagram of the method for manufacturing the semiconductor device of the first embodiment.

In step S105, a carbon film 54 is formed on the silicon carbide layer 10 (FIG. 16).

In step S106, a first heat treatment is performed. The first heat treatment is performed at 1600° C. or higher. The first heat treatment is performed in a non-oxidizing atmosphere. The first heat treatment is performed, for example, in an inert gas atmosphere. The first heat treatment is performed, for example, in an argon gas atmosphere.

By the first heat treatment, aluminum and phosphorus ion-implanted into the silicon carbide layer 10 are activated. The first heat treatment is the activation annealing of aluminum and phosphorus. In addition, by the first heat treatment, the interstitial carbon formed by carbon ion implantation into the silicon carbide layer 10 fills the carbon vacancies in the silicon carbide layer 10.

The carbon film 54 suppresses the desorption of silicon or carbon from the silicon carbide layer 10 into the atmosphere during the first heat treatment. In addition, the carbon film 54 absorbs excess interstitial carbon in the silicon carbide layer 10 during the first heat treatment.

The first heat treatment includes, for example, a first step whose temperature is 1600° C. or higher and a second step whose temperature is lower than the temperature of the first step. The temperature of the second step is, for example, equal to or lower than 1000° C.

For example, in the first step, aluminum and phosphorus ion-implanted into the silicon carbide layer 10 are activated, so that the interstitial carbon fills the carbon vacancies. For example, in the second step of low temperature, excess interstitial carbon is expelled from the silicon carbide layer 10 and absorbed by the carbon film 54.

Figure 17:
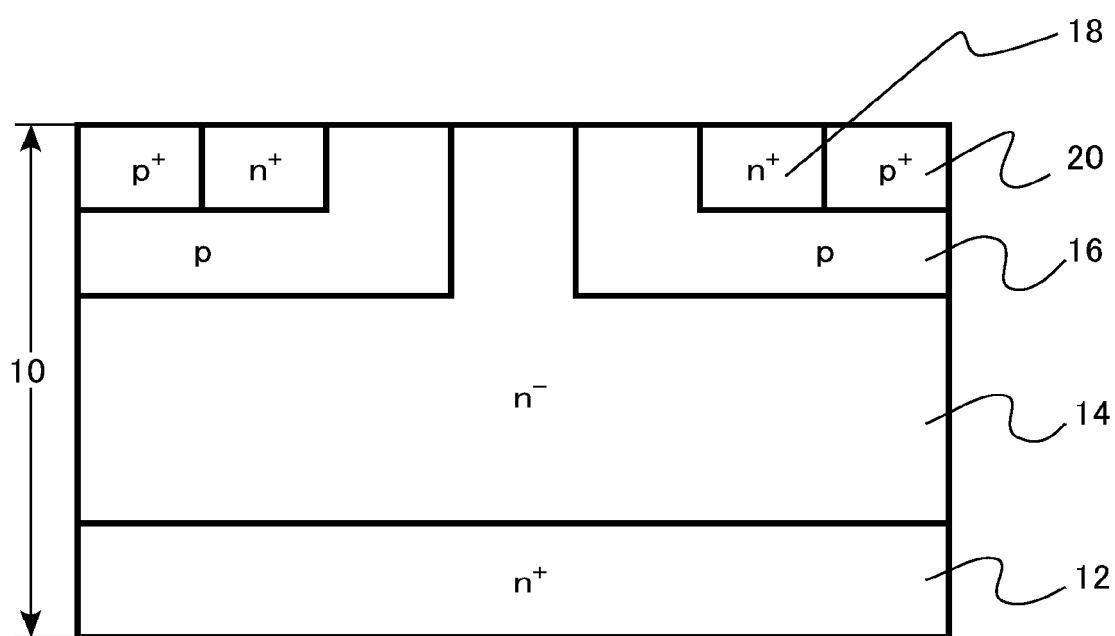
FIG. 17 is an explanatory diagram of the method for manufacturing the semiconductor device of the first embodiment.

In step S107, the carbon film 54 is removed (FIG. 17).

In step S108, a second heat treatment is performed. The second heat treatment is performed at 1100° C. or higher. The second heat treatment is performed in an atmosphere containing hydrogen.

By the second heat treatment, the oxide film on the surface of the silicon carbide layer 10 is etched. Due to the second heat treatment, atom migration occurs on the surface of the exposed silicon carbide layer 10.

A third surface structure is formed on the surface of the silicon carbide layer 10. The surface of the silicon carbide layer 10 has the third surface structure as a main surface structure. The silicon atom disposed in the first layer of the outermost surface of the third surface structure is the third silicon atom. The site position occupied by the third silicon atom is different from the site position occupied by a silicon atom in the third layer, and is also different from the site position occupied by the silicon atom in the fifth layer.

Figure 18:
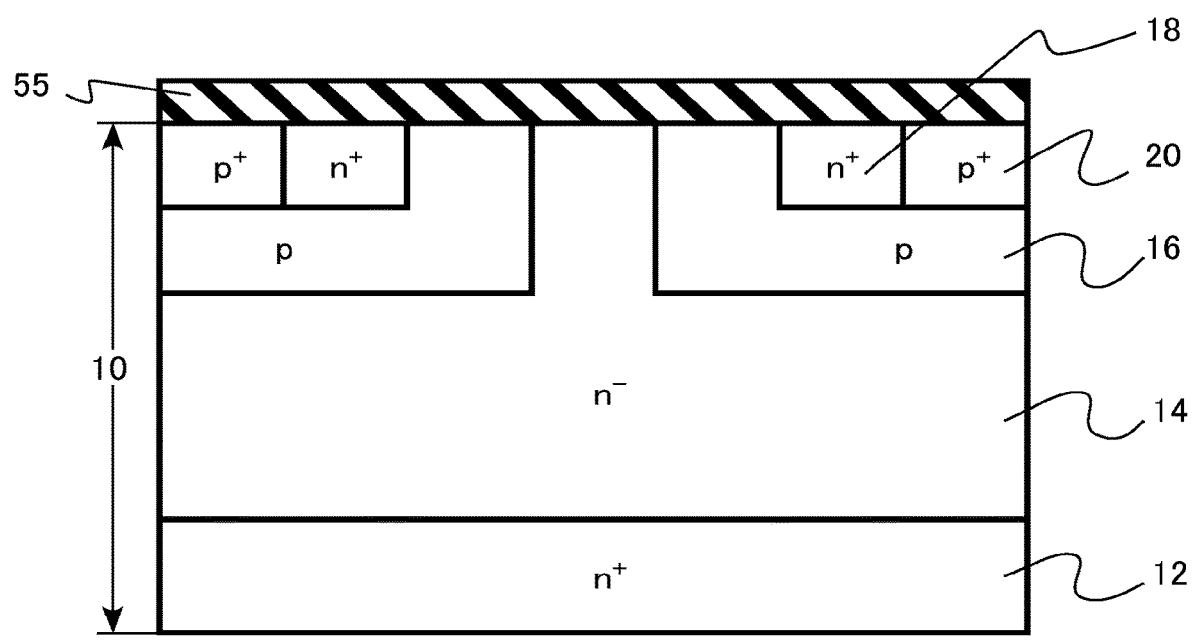
FIG. 18 is an explanatory diagram of the method for manufacturing the semiconductor device of the first embodiment.

In step S109, a silicon oxide film 55 is formed on the silicon carbide layer 10 (FIG. 18). The silicon oxide film 55 finally becomes the gate insulating layer 28.

The silicon oxide film 55 is formed by, for example, a vapor deposition method. The silicon oxide film 55 is formed by, for example, a chemical vapor deposition method (CVD method) or a physical vapor deposition method (PVD method). The formation temperature of the silicon oxide film 55 is, for example, equal to or lower than 800° C.

The silicon oxide film 55 is a sedimentary film. The thickness of the silicon oxide film 55 is, for example, equal to or more than 30 nm and equal to or less than 100 nm.

The silicon oxide film 55 is, for example, a silicon oxide film formed by a CVD method using tetraethyl orthosilicate (TEOS) as a source gas. In addition, the silicon oxide film 55 is, for example, a silicon oxide film formed by a CVD method using dichlorosilane gas ($SiH_2Cl_2$) and nitrous oxide gas ($N_2O$) as source gases.

In step S110, a third heat treatment is performed. The third heat treatment is performed in an atmosphere containing ammonia gas ($NH_3$).

For example, the ammonia gas ($NH_3$) is supplied to a reaction furnace containing the silicon carbide layer 10 to perform heat treatment.

The temperature of the third heat treatment is, for example, equal to or higher than 1200° C. and equal to or lower than 1600° C. The partial pressure of the ammonia gas in the atmosphere of the third heat treatment is, for example, equal to or more than 90%.

Figure 19:
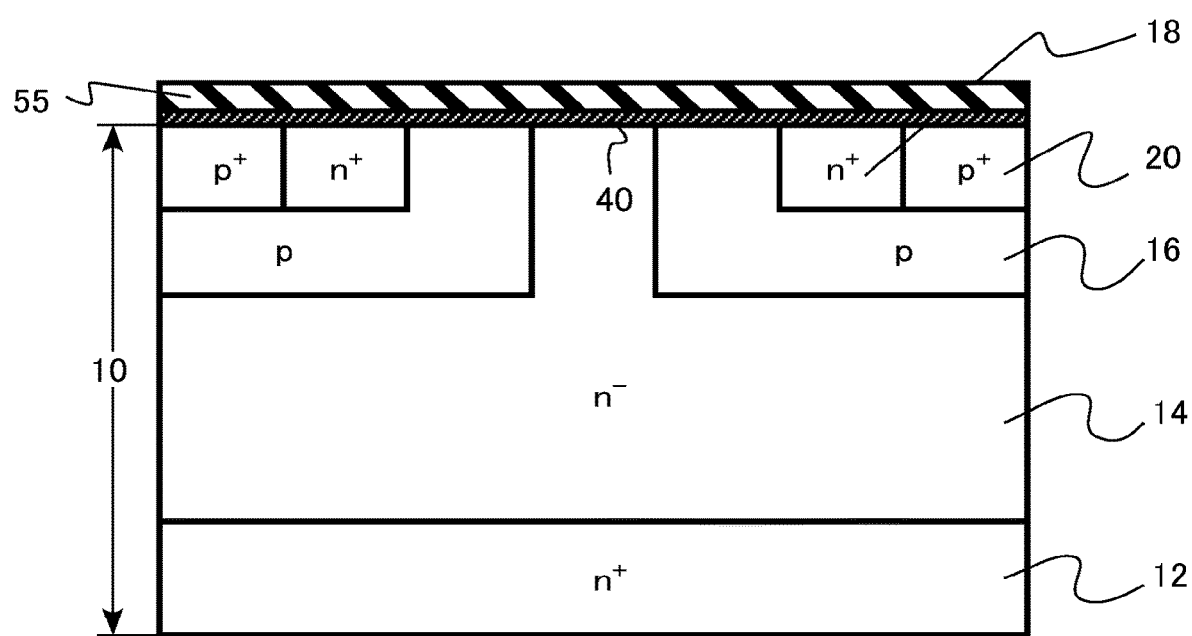
FIG. 19 is an explanatory diagram of the method for manufacturing the semiconductor device of the first embodiment.

By the third heat treatment, the interface termination region 40 is formed at the interface between the silicon carbide layer 10 and the silicon oxide film (FIG. 19). By the third heat treatment, the surface of the silicon carbide layer 10 is converted into the first surface structure.

The third heat treatment also functions as densify annealing of the silicon oxide film. By the third heat treatment, the silicon oxide film 55 becomes a high-density film.

In step S111, a fourth heat treatment is performed. The fourth heat treatment is performed in an atmosphere containing nitrogen oxide gas (NOx). The nitrogen oxide gas is, for example, a nitric oxide gas (NO). In addition, the nitrogen oxide gas is, for example, a nitrous oxide gas ($N_2O$).

For example, the nitrogen oxide gas (NOx) is supplied to a reaction furnace containing the silicon carbide layer 10 to perform heat treatment.

The temperature of the fourth heat treatment is, for example, equal to or higher than 750° C. and equal to or lower than 1050° C. The temperature of the fourth heat treatment is, for example, lower than the temperature of the third heat treatment.

The partial pressure of the nitrogen oxide gas in the atmosphere of the fourth heat treatment is, for example, equal to or more than 10%.

By the fourth heat treatment, nitrogen in the silicon oxide film is removed. By the fourth heat treatment, a silicon oxide film with reduced nitrogen defects is formed.

In step S112, the gate electrode 30 is formed on the gate insulating layer 28. The gate electrode 30 is, for example, polycrystalline silicon containing n-type impurities or p-type impurities.

Figure 20:
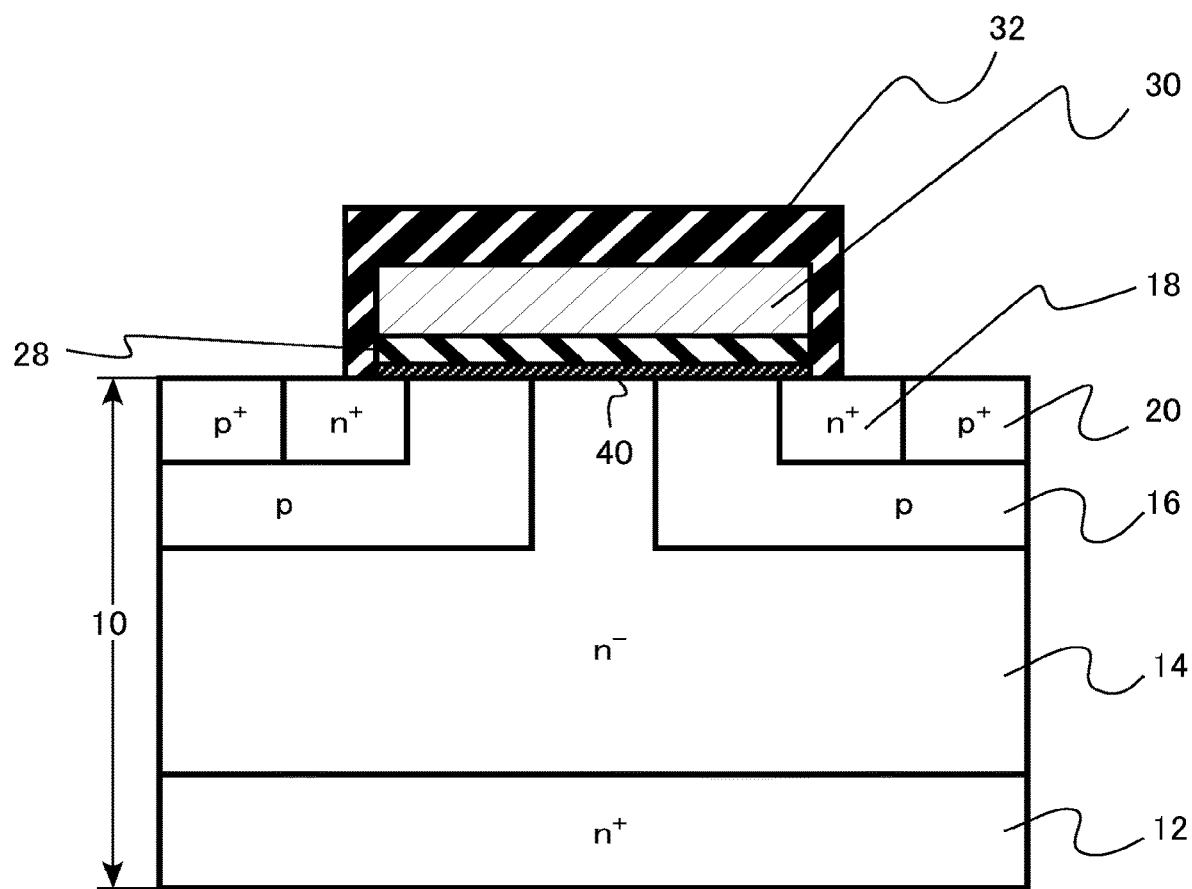
FIG. 20 is an explanatory diagram of the method for manufacturing the semiconductor device of the first embodiment.

In step S113, the interlayer insulating film 32 is formed on the gate electrode 30 (FIG. 20). The interlayer insulating film 32 is, for example, a silicon oxide film.

In step S114, the source electrode 34 and the drain electrode 36 are formed. The source electrode 34 is formed on the source region 18 and the p-well contact region 20. The source electrode 34 is formed, for example, by sputtering nickel (Ni) and aluminum (Al). The drain electrode 36 is formed on the back surface side of the silicon carbide layer 10. The drain electrode 36 is formed, for example, by sputtering nickel.

By the manufacturing method described above, the MOSFET 100 shown in FIG. 1 is formed.

Next, the function and effect of the semiconductor device of the first embodiment and the method for manufacturing the semiconductor device will be described.

In the MOSFET 100 of the first embodiment, the main surface structure of the surface of the silicon carbide layer 10 is the first surface structure having a small interface state between the silicon carbide layer 10 and the gate insulating layer 28. Therefore, the decrease in reliability of the gate insulating layer due to the interface state or the decrease in mobility of carriers due to the interface state is suppressed. In addition, the interface termination region 40 is provided in which nitrogen is segregated between the silicon carbide layer 10 and the gate insulating layer 28. Therefore, since the dangling bond on the surface of the silicon carbide layer 10 is reduced, the decrease in mobility of carriers is suppressed. As a result, the characteristics of the MOSFET 100 are improved.

In addition, in the method for manufacturing the MOSFET 100 of the first embodiment, in order for the first surface structure having a small interface state to be the main surface structure, the third surface structure is formed on the surface of the silicon carbide layer 10 during the manufacturing process. Then, by converting the third surface structure into the first surface structure, the first surface structure finally becomes the main surface structure.

Hereinafter, the function and effect of the semiconductor device of the first embodiment and the method for manufacturing the semiconductor device will be described in detail.

FIGS. 21A, 21B, and 21C are explanatory diagrams of the function and effect of the semiconductor device of the first embodiment. FIGS. 21A, 21B, and 21C are diagrams showing the result of calculating the energy state of each surface structure of the silicon carbide layer shown in FIGS. 4A, 4B, and 4C by first-principle calculation. FIG. 21A shows the case of the first surface structure shown in FIG. 4A, FIG. 21B shows the case of the second surface structure shown in FIG. 4B, and FIG. 21C shows the case of the third surface structure shown in FIG. 4C.

FIGS. 21A, 21B, and 21C show band diagrams of each surface structure. FIGS. 21A, 21B, and 21C show calculation results for a state in which the silicon carbide layer (SiC) and the silicon oxide layer ($SiO_2$) are ideally bonded to each other.

As shown in FIG. 21A, in the case of the first surface structure, no interface state is formed between the silicon carbide layer (SiC) and the silicon oxide layer ($SiO_2$).

On the other hand, as shown in FIG. 21B, in the case of the second surface structure, the interface state is formed at a position 1.2 eV higher than the lower end of the conduction band of the silicon carbide layer (SiC). In the case of the MOS structure, a leakage current of the gate insulating layer through the interface state may be generated to decrease the reliability of the gate insulating layer.

In addition, as shown in FIG. 21C, in the case of the third surface structure, the interface state is formed at a position 0.3 eV lower than the lower end of the conduction band of the silicon carbide layer (SiC). In the case of the MOSFET, electrons may be trapped at the interface state to decrease the mobility of carriers.

From the above calculation results, it can be seen that it is desirable that the surface of the silicon carbide layer has the first surface structure in order to improve the characteristics of the MOSFET.

In the MOSFET 100 of the first embodiment, the percentage of the first silicon atom among a plurality of silicon atoms present in the first layer, which is an uppermost layer of the silicon carbide layer 10, is equal to or more than 90%. Therefore, 90% or more of the surface of the silicon carbide layer 10 has the first surface structure. As a result, the decrease in reliability of the gate insulating layer 28 due to the interface state or the decrease in mobility of carriers due to the interface state is suppressed, so that the characteristics of the MOSFET 100 are improved.

From the viewpoint of suppressing the decrease in reliability of the gate insulating layer 28 or the decrease in mobility of carriers, the percentage of the first silicon atom among a plurality of silicon atoms present in the first layer is preferably equal to or more than 95%, more preferably equal to or more than 98%.

Even if the surface of the silicon carbide layer 10 has the first surface structure, it is difficult in manufacturing to make the bonding state between the silicon carbide layer 10 and the gate insulating layer 28 perfect. On the surface of the silicon carbide layer 10, dangling bonds of silicon atoms or carbon atoms can occur. When a dangling bond is present on the surface of the silicon carbide layer 10, an interface state is formed at the interface between the silicon carbide layer 10 and the gate insulating layer 28, resulting in a decrease in mobility of carriers.

The MOSFET 100 of the first embodiment includes the interface termination region 40 where nitrogen is segregated between the silicon carbide layer 10 and the gate insulating layer 28. In the interface termination region 40, the nitrogen atom is tri-coordinated with the silicon atoms, so that the dangling bond is reduced. Therefore, a MOSFET in which a decrease in mobility of carriers is suppressed is realized.

The nitrogen concentration in the interface termination region 40 is equal to or more than $1 \times 10^{21}$ $cm^{-3}$. From the viewpoint of suppressing the decrease in mobility of carriers of the MOSFET 100, the nitrogen concentration in the interface termination region 40 is preferably equal to or more than $1 \times 10^{22}$ $cm^{-3}$, more preferably equal to or more than $5 \times 10^{22}$ cm$^{-3}$. From the viewpoint of suppressing the decrease in mobility of carriers of the MOSFET 100, the peak nitrogen concentration in the interface termination region 40 of the nitrogen concentration distribution is preferably equal to or more than $1 \times 10^{22}$ cm$^{-3}$, more preferably equal to or more than $5 \times 10^{22}$ cm$^{-3}$.

Excess nitrogen in the interface termination region 40 may become a charge trap. Therefore, the peak nitrogen concentration in the interface termination region 40 of the nitrogen concentration distribution is preferably equal to or less than $4 \times 10^{23}$ cm$^{-3}$, more preferably equal to or less than $1 \times 10^{23}$ cm$^{-3}$.

The peak nitrogen concentration in the interface termination region 40 of the nitrogen concentration distribution is preferably $5.0 \times 10^{22}$ cm$^{-3} \pm 5\%$. When the peak nitrogen concentration is in the range of $5.0 \times 10^{22}$ cm$^{-3} \pm 5\%$, the MOSFET 100 exhibits good characteristics, especially with few charge traps.

The area density of nitrogen in the interface termination region 40 is preferably equal to or more than $1 \times 10^{14}$ cm$^{-2}$ and equal to or less than $2.5 \times 10^{15}$ cm$^{-2}$. The area density of nitrogen in the interface termination region 40 is preferably $1.4 \times 10^{15}$ cm$^{-2} \pm 5\%$. When the area density of nitrogen is in the above range, the MOSFET 100 exhibits good characteristics, especially with few charge traps.

From the viewpoint of suppressing the decrease in mobility of carriers of the MOSFET 100, it is preferable that 90% or more of the nitrogen atoms present in the interface termination region 40 are three-coordinated nitrogen atoms. More preferably, 99% or more of the nitrogen atoms present in the interface termination region 40 are three-coordinated nitrogen atoms. The concentration of three-coordinated nitrogen atoms present in the interface termination region 40 is, for example, equal to or more than $1 \times 10^{21}$ cm$^{-3}$. The concentration of four-coordinated nitrogen atoms present in the interface termination region 40 is, for example, equal to or less than $1 \times 10^{19}$ cm$^{-3}$.

From the viewpoint of suppressing the decrease in the threshold voltage of the MOSFET 100, the concentration of four-coordinated nitrogen atoms is preferably equal to or less than $1 \times 10^{18}$ cm$^{-3}$, more preferably equal to or less than $1 \times 10^{11}$ cm$^{-3}$.

The interface termination region 40 is formed by supplying nitrogen to the interface between the silicon carbide layer 10 and the gate insulating layer 28 after forming the gate insulating layer 28. The interface termination region 40 is formed by substituting the carbon atom in the uppermost layer of the surface of the silicon carbide layer 10 with the nitrogen atom. At this time, the silicon atom in the uppermost layer is bonded to the oxygen atom in the gate insulating layer 28 to become a part of the gate insulating layer 28.

Figure 22:
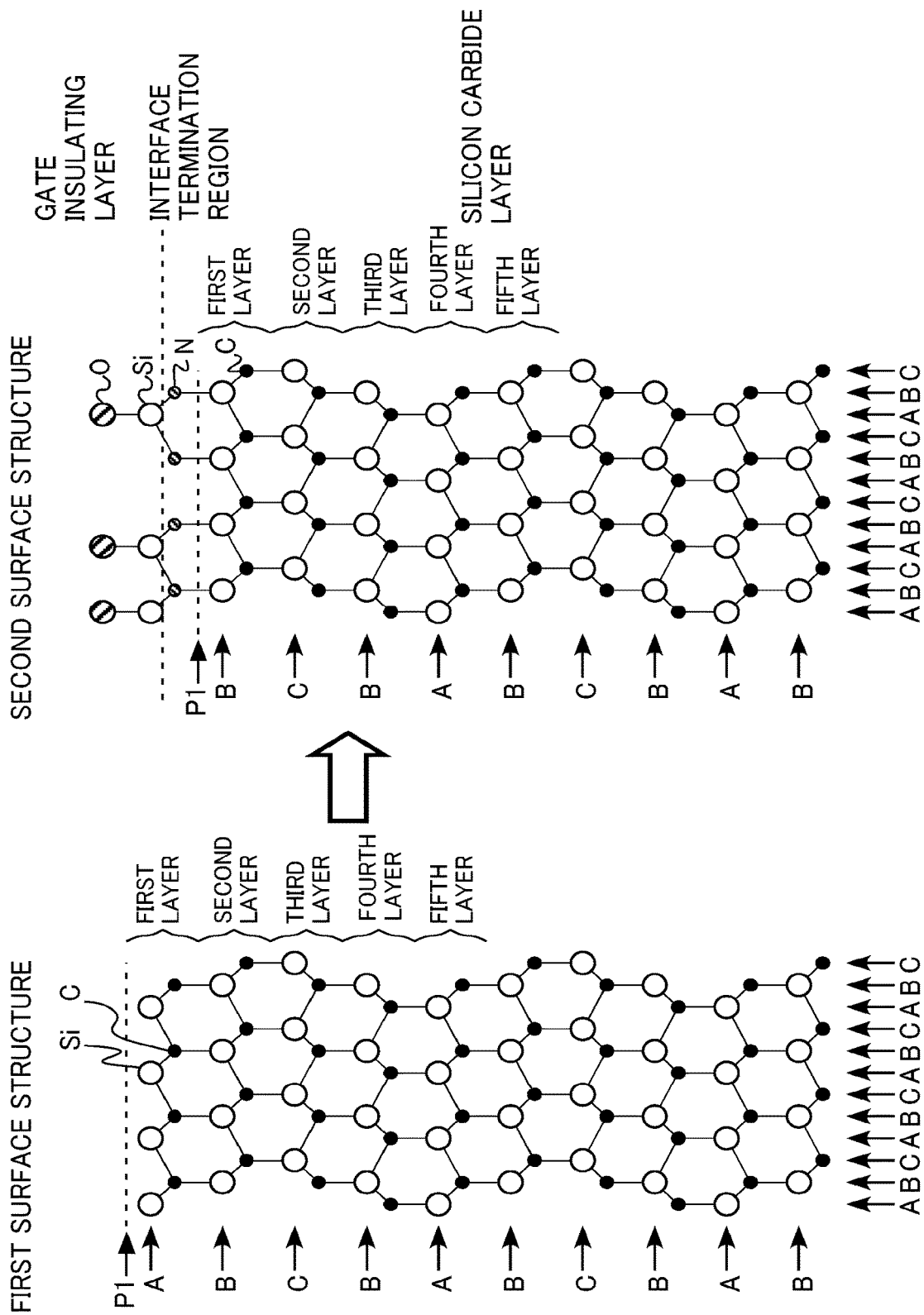
FIG. 22 is an explanatory diagram of the function and effect of the semiconductor device of the first embodiment.

FIG. 22 is an explanatory diagram of the function and effect of the semiconductor device of the first embodiment. FIG. 22 is a diagram showing a change in a surface structure when a gate insulating layer and an interface termination region are formed on the surface of a silicon carbide layer having a first surface structure.

As shown in FIG. 22, when forming the interface termination region, the carbon atom in the first layer is substituted by the nitrogen atom. The silicon atom in the first layer is bonded to the oxygen atom in the gate insulating layer to become a part of the gate insulating layer. Before the interface termination region is formed, the silicon atom in the first layer is the first silicon atom as shown on the left side of FIG. 22. On the other hand, after the interface termination region is formed, the silicon atom in the first layer is the second silicon atom as shown on the right side of FIG. 22. In other words, after the interface termination region is formed, the surface of the silicon carbide layer is converted from the first surface structure to the second surface structure.

Figure 23:
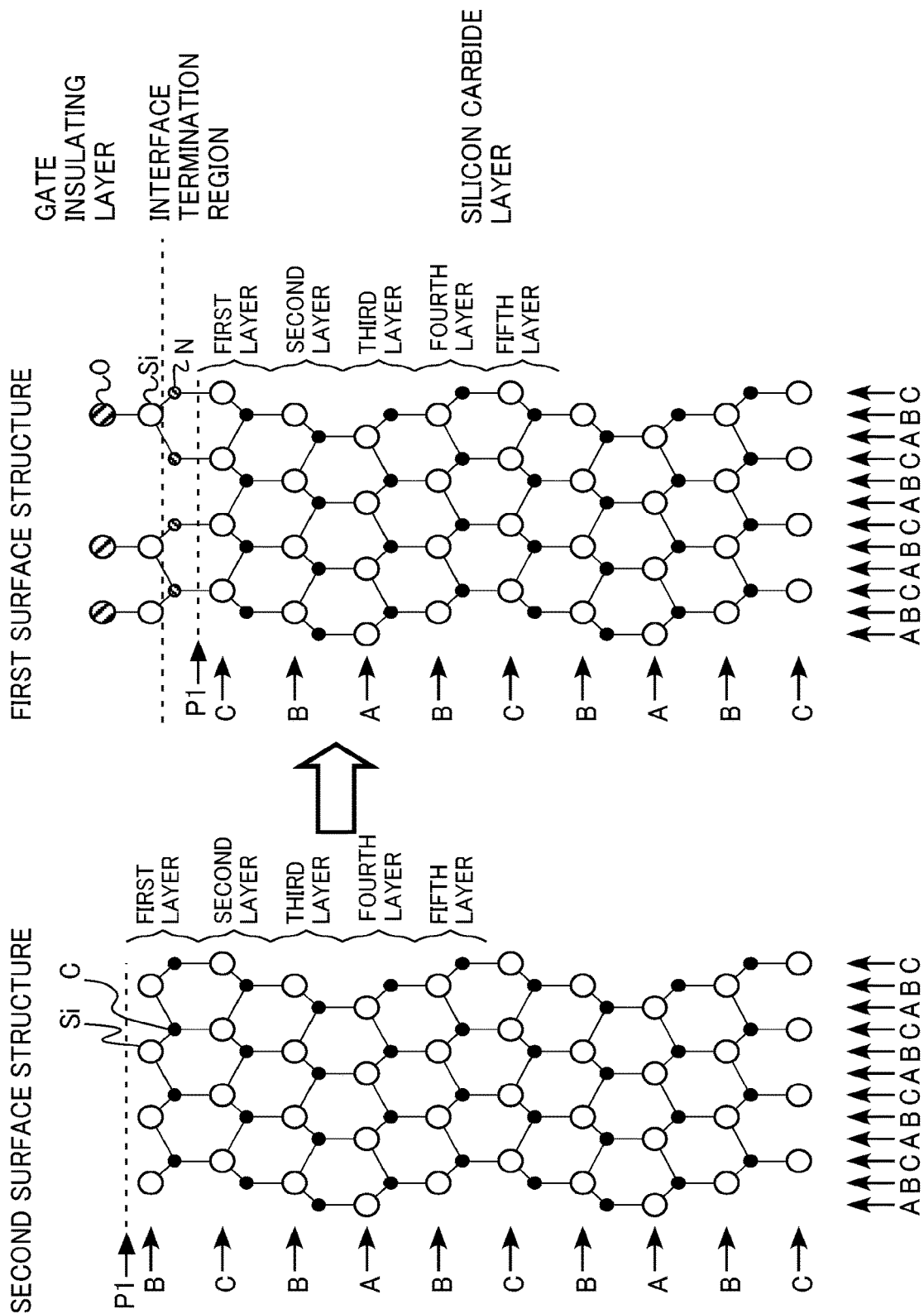
FIG. 23 is an explanatory diagram of the function and effect of the semiconductor device of the first embodiment.

FIG. 23 is an explanatory diagram of the function and effect of the semiconductor device of the first embodiment. FIG. 23 is a diagram showing a change in a surface structure when a gate insulating layer and an interface termination region are formed on the surface of a silicon carbide layer having a second surface structure.

As shown in FIG. 23, when forming the interface termination region, the carbon atom in the first layer is substituted by the nitrogen atom. The silicon atom in the first layer that is the uppermost layer is bonded to the oxygen atom in the gate insulating layer to become a part of the gate insulating layer. Before the interface termination region is formed, the silicon atom in the first layer is the second silicon atom as shown on the left side of FIG. 23. On the other hand, after the interface termination region is formed, the silicon atom in the first layer is the first silicon atom as shown on the right side of FIG. 23. In other words, after the interface termination region is formed, the surface of the silicon carbide layer is converted from the second surface structure to the first surface structure.

Figure 24:
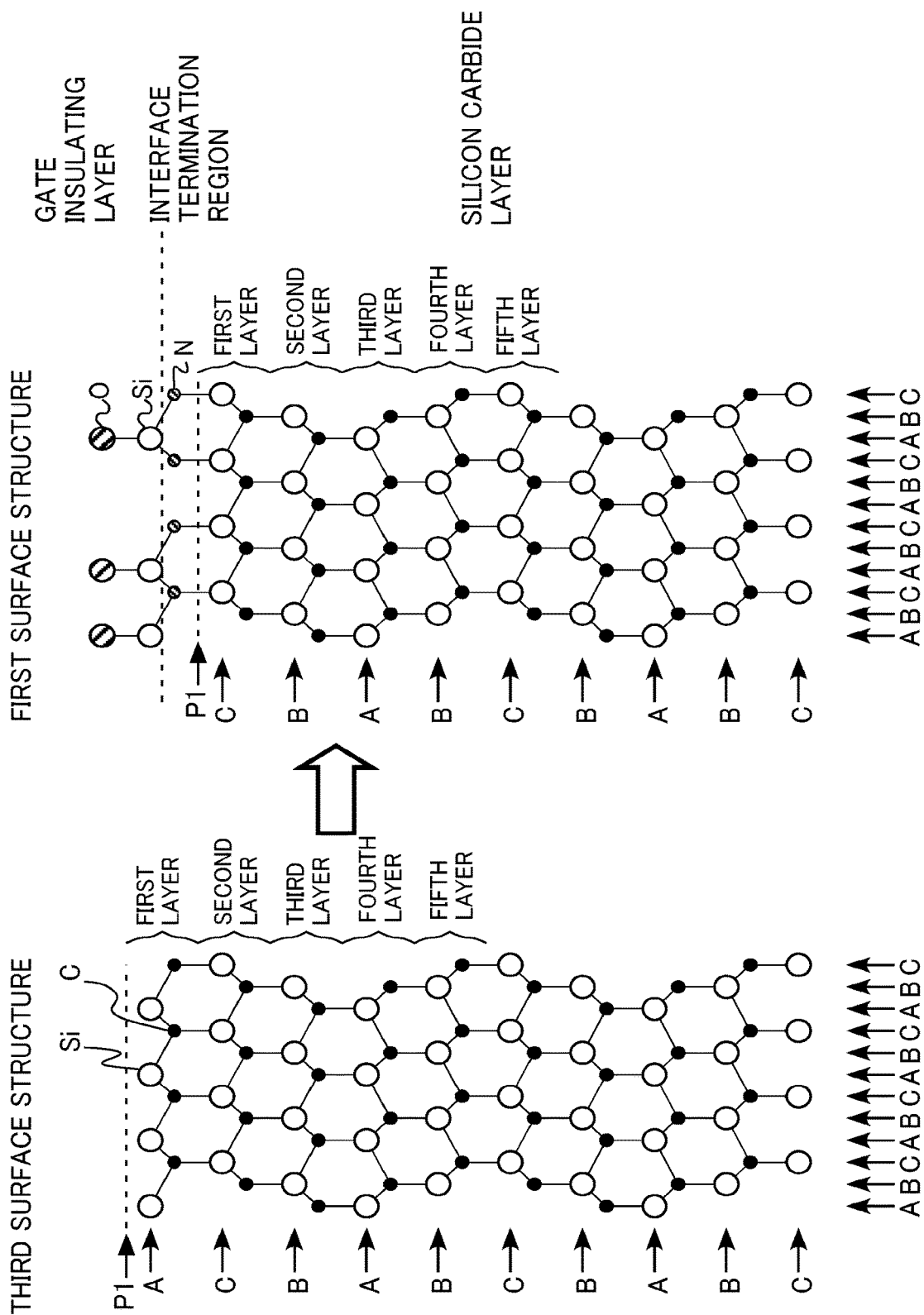
FIG. 24 is an explanatory diagram of the function and effect of the semiconductor device of the first embodiment.

FIG. 24 is an explanatory diagram of the function and effect of the semiconductor device of the first embodiment. FIG. 24 is a diagram showing a change in a surface structure when a gate insulating layer and an interface termination region are formed on the surface of a silicon carbide layer having a third surface structure.

As shown in FIG. 24, when forming the interface termination region, the carbon atom in the first layer is substituted by the nitrogen atom. The silicon atom in the first layer is bonded to the oxygen atom in the gate insulating layer to become a part of the gate insulating layer. Before the interface termination region is formed, the silicon atom in the first layer is the third silicon atom as shown on the left side of FIG. 24. On the other hand, after the interface termination region is formed, the silicon atom in the first layer is the first silicon atom as shown on the right side of FIG. 24. In other words, after the interface termination region is formed, the surface of the silicon carbide layer is converted from the third surface structure to the first surface structure.

As described above, from the viewpoint of improving the characteristics of the MOSFET, it is preferable that the surface of the silicon carbide layer has the first surface structure, and it is not preferable that the surface of the silicon carbide layer has the second surface structure or the third surface structure.

As described with reference to FIGS. 22, 23, and 24, in order to make the surface of the silicon carbide layer have the first surface structure after forming the interface termination region, the surface of the silicon carbide layer needs to have the second surface structure or the third surface structure before forming the interface termination region.

Figure 25:
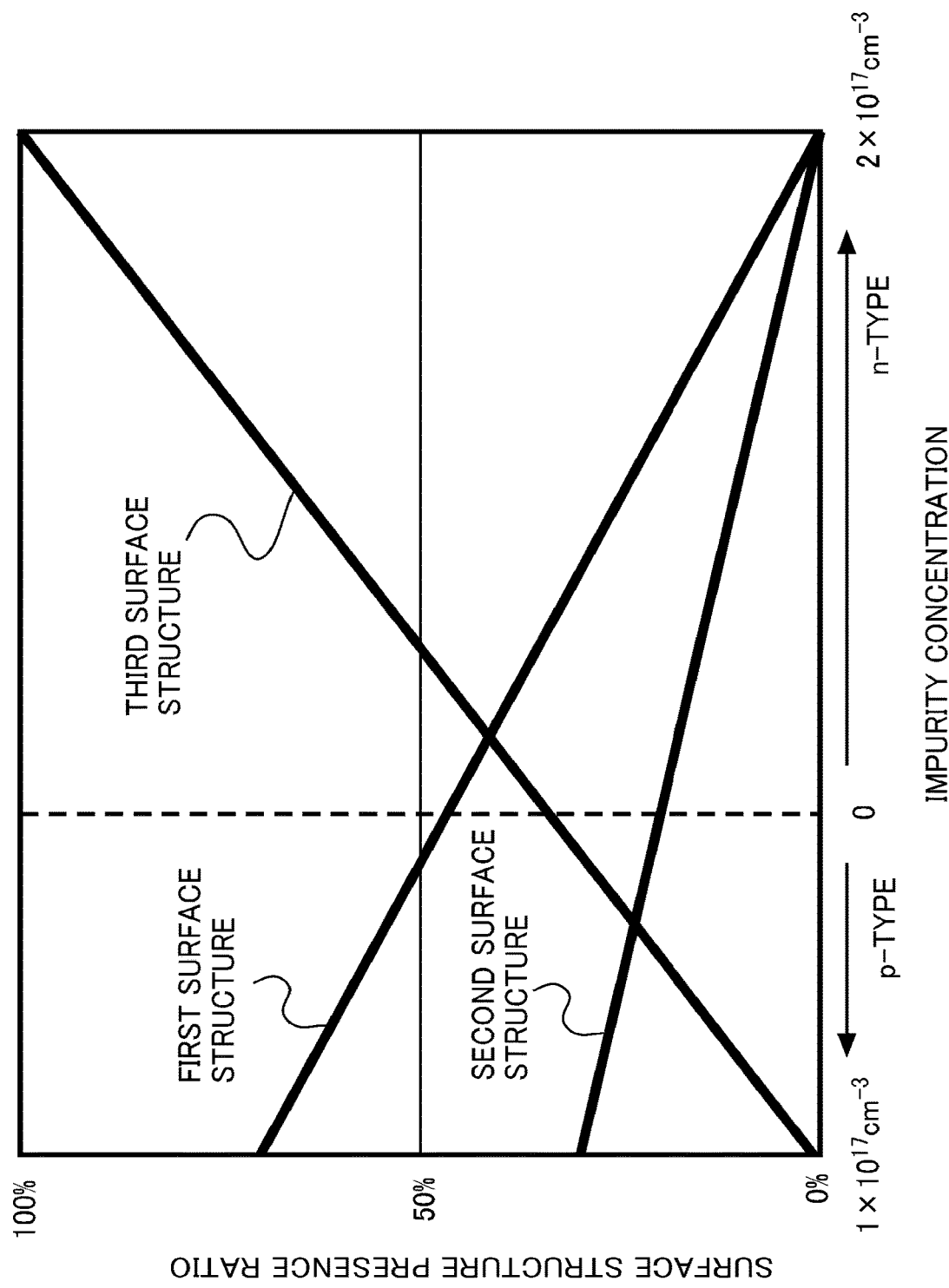
FIG. 25 is an explanatory diagram of the function and effect of the semiconductor device of the first embodiment.

FIG. 25 is an explanatory diagram of the function and effect of the semiconductor device of the first embodiment. FIG. 25 is a diagram showing the impurity concentration dependence of the presence ratio of the surface structure of the silicon carbide layer. FIG. 25 shows a result of calculating the presence ratio of the surface structure that can be stably present on the surface of the silicon carbide layer by using the concentration of p-type impurities or n-type impurities contained in the silicon carbide layer as a parameter. The calculation is performed by the first-principle calculation.

As shown in FIG. 25, as the concentration of p-type impurities contained in the silicon carbide layer increases, the presence ratio of the first surface structure and the second surface structure increases. On the other hand, as the concentration of n-type impurities contained in the silicon carbide layer increases, the presence ratio of the third surface structure increases.

As described above, in order to make the surface of the silicon carbide layer have a first surface structure after forming the interface termination region, the surface of the silicon carbide layer needs to have a second surface structure or a third surface structure before forming the interface termination region.

If the silicon carbide layer contains n-type impurities before forming the interface termination region, the presence ratio of the third surface structure can be increased. In particular, when the concentration of n-type impurities contained in the silicon carbide layer is about $2 \times 10^{17}$ cm$^{-3}$, the presence ratio of the third surface structure can be 100%.

The MOSFET 100 is an n-channel MOSFET. Therefore, the MOS structure is formed in the p-type p-well region 16. For this reason, the impurities contained in the silicon carbide layer 10 before the formation of the interface termination region 40 are p-type impurities. Therefore, it is difficult to make n-type impurities of about $2 \times 10^{17}$ cm$^{-3}$ be included in the silicon carbide layer 10 before forming the interface termination region 40.

Conceivably, the reason why the presence ratio of the third surface structure is high when the silicon carbide layer contains n-type impurities is that electrons are supplied from the n-type impurities and accordingly, the third surface structure becomes stable.

Therefore, in the method for manufacturing the MOSFET 100 of the first embodiment, the second heat treatment is performed in step S108 before the interface termination region 40 is formed. The second heat treatment is performed in an atmosphere containing hydrogen at a temperature of 1100° C. or higher.

By the second heat treatment, the oxide film on the surface of the silicon carbide layer 10 is etched. By etching the oxide film on the surface of the silicon carbide layer 10, dangling bonds of a large number of silicon atoms are formed on the surface of the silicon carbide layer 10. The dangling bonds serve as an electron supply source.

Due to the second heat treatment, atom migration occurs on the surface of the exposed silicon carbide layer 10. Since the atom migration occurs in a state in which electrons can be supplied from the dangling bond, the third surface structure is formed as a stable structure on the surface of the silicon carbide layer 10.

However, when a large number of carbon vacancies are present in the silicon carbide layer 10 during the second heat treatment, the electrons supplied from the dangling bond may be trapped in the carbon vacancies to inhibit the formation of the third surface structure on the surface of the silicon carbide layer 10.

Therefore, in the method for manufacturing the MOSFET 100 of the first embodiment, carbon is ion-implanted into the p-well region 16 in step S102. The p-well region 16 is formed by aluminum ion implantation in step S101. A large amount of carbon vacancies are formed in the p-well region 16 by aluminum ion implantation.

A large amount of carbon vacancies formed by aluminum ion implantation are eliminated by carbon ion implantation into the p-well region 16. By setting the second dose amount of carbon to 10 times or more the first dose amount of aluminum, a large amount of carbon vacancies are eliminated.

Since the amount of carbon vacancies in the p-well region 16 is reduced, electron trapping by the carbon vacancies does not occur. Therefore, the formation of the third surface structure on the surface of the silicon carbide layer 10 is not inhibited.

Then, the amount of carbon vacancies in the p-well region 16 is reduced by carbon ion implantation, so that the scattering of carriers by the carbon vacancies is suppressed. Therefore, the mobility of carriers in the MOSFET 100 is further improved.

From the viewpoint of appropriately maintaining the concentration of p-type impurities in the p-well region 16, it is preferable that the first dose amount of aluminum is equal to or less than $1 \times 10^{14}$ cm$^{-2}$. From the viewpoint of reducing the amount of carbon vacancies in the p-well region 16, the second dose amount of carbon is preferably equal to or more than $1 \times 10^{15}$ cm$^{-2}$, more preferably equal to or more than $1 \times 10^{16}$ cm$^{-2}$.

From the viewpoint of reducing the amount of carbon vacancies in the p-well region 16, it is preferable that the second dose amount of carbon is equal to or more than 100 times the first dose amount of aluminum.

From the viewpoint of reducing the amount of carbon vacancies in the p-well region 16, the second projected range Rp2 of carbon ion implantation is preferably equal to or more than 80% and equal to or less than 120% of the first projected range Rp1 of aluminum ion implantation, more preferably equal to or more than 90% and equal to or less than 110%.

By bringing the first projected range Rp1 and the second projected range Rp2 closer to each other, it becomes easy for the carbon concentration distribution after ion implantation to completely cover the aluminum concentration distribution after ion implantation. The amount of carbon vacancies in the p-well region 16 is reduced by completely covering the aluminum concentration distribution after ion implantation with the carbon concentration distribution after ion implantation.

From the viewpoint of appropriately maintaining the depth of the p-well region 16, it is preferable that the first projected range Rp1 and the second projected range Rp2 are equal to or less than 0.6 μm.

In the method for manufacturing the MOSFET 100 of the first embodiment, carbon is ion-implanted into the silicon carbide layer 10 in step S102, and heat treatment is performed at 1100° C. or higher in an atmosphere containing hydrogen in step 103. In this manner, even if the surface of the silicon carbide layer 10 is p-type, it is possible to increase the presence ratio of the third surface structure on the surface of the silicon carbide layer 10.

In addition, in the method for manufacturing the MOSFET 100 of the first embodiment, the gate insulating layer 28 is formed by the vapor deposition method. Therefore, oxidation of the surface of the silicon carbide layer 10 is suppressed. As a result, the third surface structure formed on the surface of the silicon carbide layer 10 is maintained even after the gate insulating layer 28 is formed.

In addition, in the method for manufacturing the MOSFET 100 of the first embodiment, the interface termination region 40 is formed by the third heat treatment in an atmosphere containing ammonia gas ($NH_3$). The interface termination region 40 is formed in an atmosphere containing ammonia gas without interface oxidation. Then, only the silicon atom in the first layer, which is the uppermost layer of the third surface structure, is bonded to the oxygen atom in the gate insulating layer 28. Therefore, the surface of the silicon carbide layer 10 after the interface termination region 40 is formed can be converted into the first surface structure with good controllability.

As described above, according to the first embodiment, a semiconductor device having improved characteristics and a method for manufacturing the semiconductor device are realized.

Second Embodiment

An inverter circuit and a drive device of a second embodiment are an inverter circuit and a drive device including the semiconductor device of the first embodiment.

Figure 26:
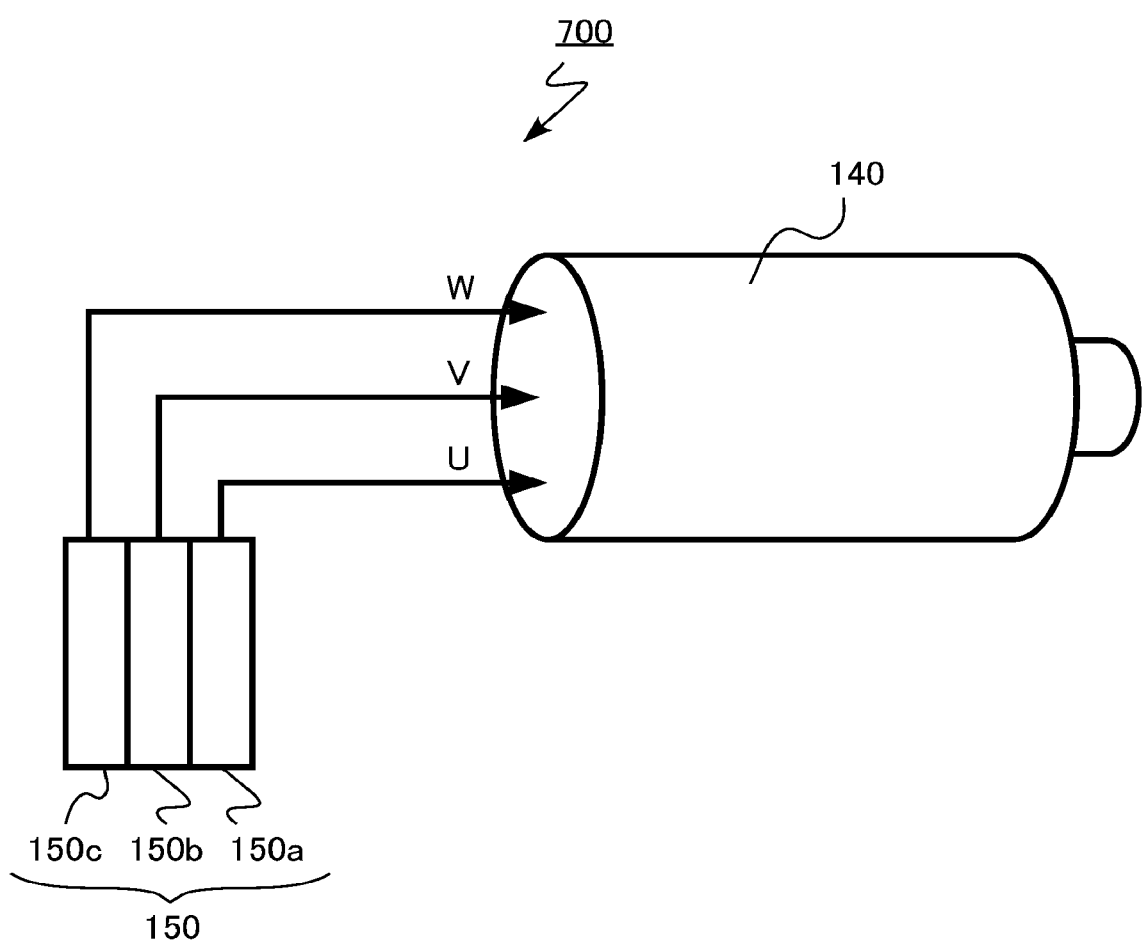
FIG. 26 is a schematic diagram of a drive device of a second embodiment.

FIG. 26 is a schematic diagram of the drive device of the second embodiment. A drive device 700 includes a motor 140 and an inverter circuit 150.

The inverter circuit 150 includes three semiconductor modules 150a, 150b, and 150c having the MOSFET 100 of the first embodiment as a switching element. By connecting the three semiconductor modules 150a, 150b, and 150c in parallel to each other, a three-phase inverter circuit 150 having three AC voltage output terminals U, V, and W is realized. The motor 140 is driven by the AC voltage output from the inverter circuit 150.

According to the second embodiment, the characteristics of the inverter circuit 150 and the drive device 700 are improved by providing the MOSFET 100 with improved characteristics.

Third Embodiment

A vehicle of a third embodiment is a vehicle including the semiconductor device of the first embodiment.

Figure 27:
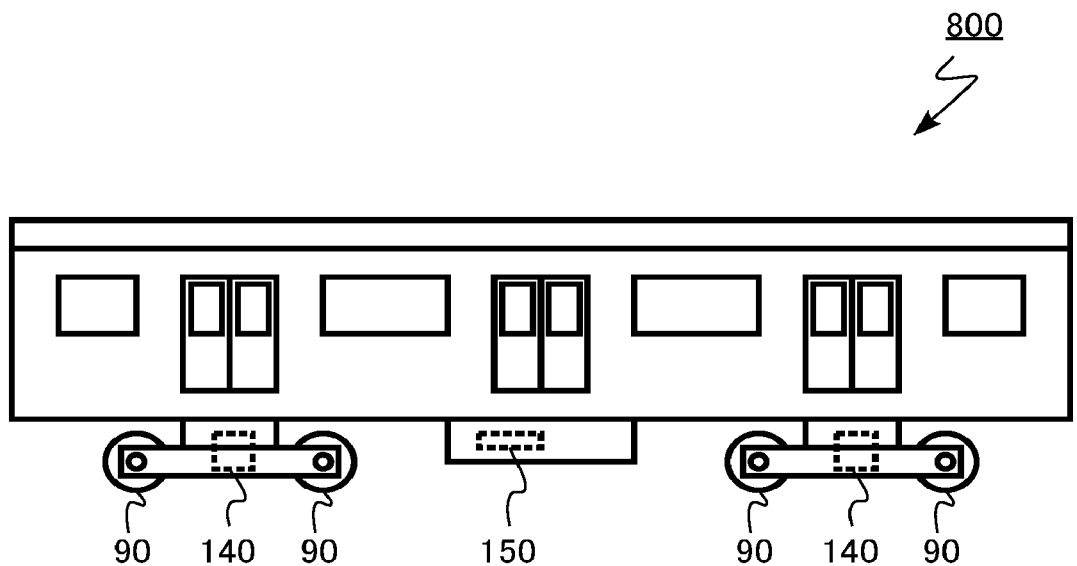
FIG. 27 is a schematic diagram of a vehicle of a third embodiment.

FIG. 27 is a schematic diagram of the vehicle of the third embodiment. A vehicle 800 of the third embodiment is a railroad vehicle. The vehicle 800 includes a motor 140 and an inverter circuit 150.

The inverter circuit 150 includes three semiconductor modules having the MOSFET 100 of the first embodiment as a switching element. By connecting the three semiconductor modules in parallel to each other, a three-phase inverter circuit 150 having three AC voltage output terminals U, V, and W is realized. The motor 140 is driven by the AC voltage output from the inverter circuit 150. The motor 140 rotates wheels 90 of the vehicle 800.

According to the third embodiment, the characteristics of the vehicle 800 are improved by providing the MOSFET 100 with improved characteristics.

Fourth Embodiment

A vehicle of a fourth embodiment is a vehicle including the semiconductor device of the first embodiment.

Figure 28:
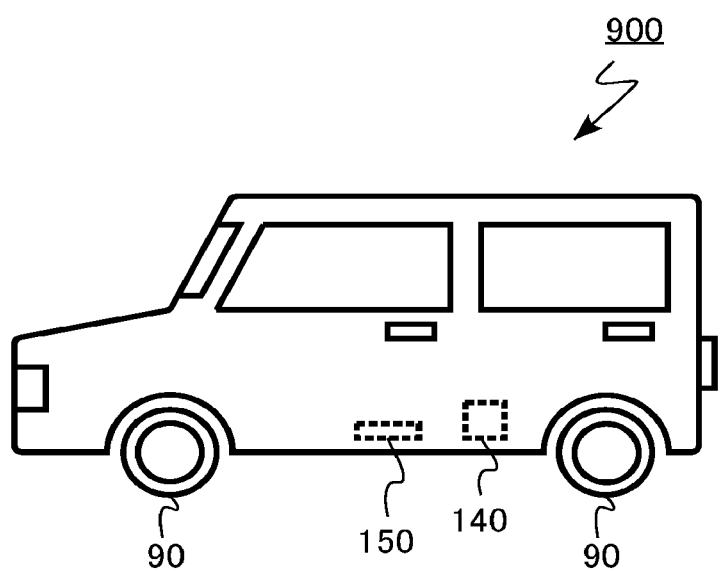
FIG. 28 is a schematic diagram of a vehicle of a fourth embodiment.

FIG. 28 is a schematic diagram of the vehicle of the fourth embodiment. A vehicle 900 of the fourth embodiment is an automobile. The vehicle 900 includes a motor 140 and an inverter circuit 150.

The inverter circuit 150 includes three semiconductor modules having the MOSFET 100 of the first embodiment as a switching element. By connecting the three semiconductor modules in parallel to each other, a three-phase inverter circuit 150 having three AC voltage output terminals U, V, and W is realized.

The motor 140 is driven by the AC voltage output from the inverter circuit 150. The motor 140 rotates wheels 90 of the vehicle 900.

According to the fourth embodiment, the characteristics of the vehicle 900 are improved by providing the MOSFET 100 with improved characteristics.

Fifth Embodiment

An elevator of a fifth embodiment is an elevator including the semiconductor device of the first embodiment.

Figure 29:
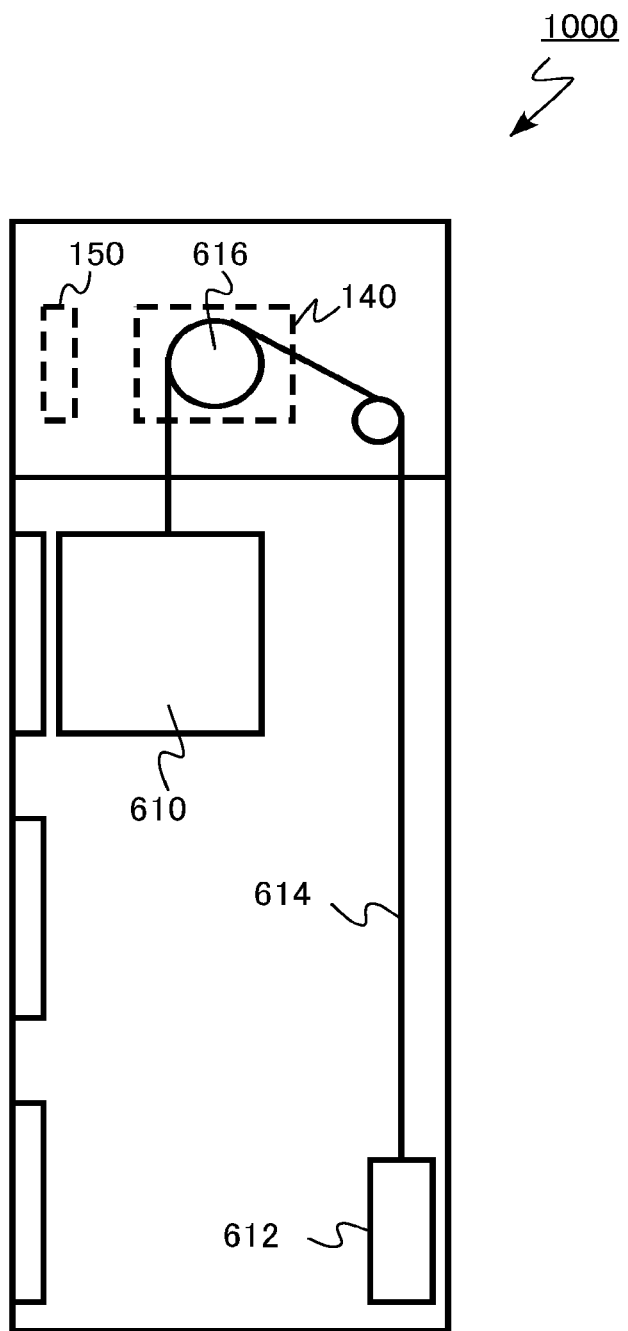
FIG. 29 is a schematic diagram of an elevator of a fifth embodiment.

FIG. 29 is a schematic diagram of the elevator of the fifth embodiment. An elevator 1000 of the fifth embodiment includes a car 610, a counterweight 612, a wire rope 614, a hoisting machine 616, a motor 140, and an inverter circuit 150.

The inverter circuit 150 includes three semiconductor modules having the MOSFET 100 of the first embodiment as a switching element. By connecting the three semiconductor modules in parallel to each other, a three-phase inverter circuit 150 having three AC voltage output terminals U, V, and W is realized.

The motor 140 is driven by the AC voltage output from the inverter circuit 150. The hoisting machine 616 is rotated by the motor 140, and the car 610 is moved up and down.

According to the fifth embodiment, the characteristics of the elevator 1000 are improved by providing the MOSFET 100 with improved characteristics.

In the first embodiment, the n-channel MOSFET has been described as an example, but embodiments can also be applied to an n-channel insulated gate bipolar transistor (IGBT).

In addition, in the third to fifth embodiments, the cases where the semiconductor devices of the embodiments are applied to a vehicle or an elevator have been described as examples, but the semiconductor devices of the embodiments can also be applied to, for example, a power conditioner of a photovoltaic power generation system.

While certain embodiments have been described, these embodiments have been presented by way of example only, and are not intended to limit the scope of the inventions. Indeed, the semiconductor device, the semiconductor device manufacturing method, the inverter circuit, the drive device, the vehicle, and the elevator described herein may be embodied in a variety of other forms; furthermore, various omissions, substitutions and changes in the form of the devices and methods described herein may be made without departing from the spirit of the inventions. The accompanying claims and their equivalents are intended to cover such forms or modifications as would fall within the scope and spirit of the inventions.

What is claimed is:

1. A semiconductor device, comprising:
a silicon carbide layer having a first face having an off-angle of 0° or more and 8° or less with respect to a {0001} face and a second face opposite to the first face, the silicon carbide layer having a 4H—SiC crystal structure, the silicon carbide layer including a p-type silicon carbide region in contact with the first face, the silicon carbide layer including a first layer, a second layer, a third layer, a fourth layer, and a fifth layer, the first layer, the second layer, the third layer, the fourth layer, and the fifth layer disposed from the first face towards the second face in this order, the first layer being an uppermost layer in the silicon carbide layer and in contact with the first face, a percentage of a first silicon atom among a plurality of silicon atoms present in the first layer being equal to or more than 90%, the first silicon atom being a silicon atom occupying a site position different from a site position occupied by a silicon atom in the third layer below the first silicon atom and occupying a site position the same as a site position occupied by a silicon atom in the fifth layer below the first silicon atom;

a gate electrode;

a silicon oxide layer disposed between the silicon carbide layer and the gate electrode; and a region disposed between the silicon carbide layer and the silicon oxide layer and having a nitrogen concentration of $1\times10^{21}$ cm$^{-3}$ or more.

2. The semiconductor device according to claim 1, wherein silicon atoms other than the first silicon atom among the plurality of silicon atoms include a second silicon atom or a third silicon atom, a site position occupied by the second silicon atom is the same as a site position occupied by a silicon atom in the third layer below the second silicon atom and the same as a site position occupied by a silicon atom in the fifth layer below the second silicon atom, and a site position occupied by the third silicon atom is different from a site position occupied by a silicon atom in the third layer below the third silicon atom and different from a site position occupied by a silicon atom in the fifth layer below the third silicon atom.

3. The semiconductor device according to claim 1, wherein a percentage of the first silicon atom among the plurality of silicon atoms present in the first layer is equal to or more than 95%.

4. The semiconductor device according to claim 1, wherein a nitrogen concentration distribution in the silicon carbide layer, the silicon oxide layer, and the region has a peak in the region.

5. The semiconductor device according to claim 4, wherein a nitrogen concentration at a first position 1 nm away from the peak toward the silicon oxide layer is equal to or less than $1\times10^{18}$ cm$^{-3}$, and a nitrogen concentration at a second position 1 nm away from the peak toward the silicon carbide layer is equal to or less than $1\times10^{18}$ cm$^{-3}$.

6. The semiconductor device according to claim 1, wherein the nitrogen concentration in the region is equal to or more than $1\times10^{22}$ cm$^{-3}$.

7. An inverter circuit comprising the semiconductor device according to claim 1.

8. A drive device comprising the semiconductor device according to claim 1.

9. A vehicle comprising the semiconductor device according to claim 1.

10. An elevator comprising the semiconductor device according to claim 1.

* * * * *